(12) United States Patent
Sankman et al.

(10) Patent No.: US 12,199,085 B2
(45) Date of Patent: Jan. 14, 2025

(54) MULTI-CHIP PACKAGING

(71) Applicant: Intel Corporation, Santa Clara, CA (US)

(72) Inventors: Robert L. Sankman, Phoenix, AZ (US); Sairam Agraharam, Chandler, AZ (US); Shengquan Ou, Chandler, AZ (US); Thomas J De Bonis, Tempe, AZ (US); Todd Spencer, Chandler, AZ (US); Yang Sun, Chandler, AZ (US); Guotao Wang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/716,934

(22) Filed: Apr. 8, 2022

(65) Prior Publication Data

US 2022/0231007 A1 Jul. 21, 2022

Related U.S. Application Data

(63) Continuation of application No. 17/587,657, filed on Jan. 28, 2022, now Pat. No. 11,817,444, which is a
(Continued)

(51) Int. Cl.
*H01L 25/00* (2006.01)
*H01L 21/56* (2006.01)
(Continued)

(52) U.S. Cl.
CPC ........... *H01L 25/50* (2013.01); *H01L 21/563* (2013.01); *H01L 23/5381* (2013.01);
(Continued)

(58) Field of Classification Search
CPC ... H01L 25/50; H01L 21/563; H01L 23/5381; H01L 23/5385; H01L 24/06; H01L 24/11;
(Continued)

(56) References Cited

U.S. PATENT DOCUMENTS

| 9,653,428 B1 | 5/2017 | Hiner |
| 10,700,051 B2 | 6/2020 | Sankman et al. |

(Continued)

FOREIGN PATENT DOCUMENTS

| CN | 101232004 | 7/2008 |
| CN | 111886693 | 11/2020 |

(Continued)

OTHER PUBLICATIONS

Notice of Allowance for Taiwan Patent Application No. 108114442 mailed Mar. 20, 2023, 3 pgs.
(Continued)

*Primary Examiner* — Thanh T Nguyen
(74) *Attorney, Agent, or Firm* — Schwabe, Williamson & Wyatt, P.C.

(57) ABSTRACT

An electronic device may include a first die that may include a first set of die contacts. The electronic device may include a second die that may include a second set of die contacts. The electronic device may include a bridge interconnect that may include a first set of bridge contacts and may include a second set of bridge contacts. The first set of bridge contacts may be directly coupled to the first set of die contacts (e.g., with an interconnecting material, such as solder). The second set of bridge contacts may be directly coupled to the second set of die contacts (e.g., with solder). The bridge interconnect may help facilitate electrical communication between the first die and the second die.

23 Claims, 12 Drawing Sheets

Related U.S. Application Data continuation of application No. 16/892,698, filed on Jun. 4, 2020, now Pat. No. 11,348,911, which is a continuation of application No. 15/996,870, filed on Jun. 4, 2018, now Pat. No. 10,700,051.

(51) Int. Cl.
*H01L 23/00* (2006.01)
*H01L 23/538* (2006.01)
*H01L 25/18* (2023.01)

(52) U.S. Cl.
CPC .......... *H01L 23/5385* (2013.01); *H01L 24/06* (2013.01); *H01L 24/11* (2013.01); *H01L 24/16* (2013.01); *H01L 24/17* (2013.01); *H01L 25/18* (2013.01); *H01L 2224/0603* (2013.01); *H01L 2224/11013* (2013.01); *H01L 2224/16145* (2013.01); *H01L 2224/16227* (2013.01); *H01L 2224/16238* (2013.01); *H01L 2224/1703* (2013.01); *H01L 2224/17051* (2013.01)

(58) Field of Classification Search
CPC ......... H01L 24/16; H01L 24/17; H01L 25/18; H01L 2224/0603; H01L 2224/11013; H01L 2224/16145; H01L 2224/16227; H01L 2224/16238; H01L 2224/1703; H01L 2224/17051; H01L 24/19; H01L 24/81; H01L 24/95; H01L 2223/54426; H01L 2224/0557; H01L 2224/06181; H01L 2224/08145; H01L 2224/131; H01L 24/96; H01L 25/0652; H01L 2224/32225; H01L 2224/32245; H01L 2224/73204; H01L 2224/73209; H01L 2224/73253; H01L 2224/81005; H01L 2224/81191; H01L 2224/81192; H01L 2224/81986; H01L 2224/82039; H01L 2224/92224; H01L 2224/95001; H01L 2225/06513; H01L 2225/06517; H01L 2225/06541; H01L 2225/06562; H01L 2225/06586; H01L 2924/15192; H01L 2924/16251; H01L 2924/18161; H01L 2924/18162; H01L 25/0655; H01L 23/49816; H01L 23/5389; H01L 2224/04105; H01L 2224/08225; H01L 2224/12105; H01L 2224/1329; H01L 2224/133; H01L 2224/9202; H01L 2224/97; H01L 21/56; H01L 21/568; H01L 23/3135; H01L 23/3128; H01L 23/3107; H01L 23/481; H01L 23/5386

See application file for complete search history.

(56) References Cited

U.S. PATENT DOCUMENTS

| | | | |
|---|---|---|---|
| 11,469,206 | B2 | 10/2022 | Elsherbini |
| 2006/0226527 | A1 | 10/2006 | Hatano |
| 2013/0168854 | A1 | 7/2013 | Karikalan |
| 2013/0200511 | A1 | 8/2013 | Banijamali |
| 2015/0364422 | A1 | 12/2015 | Zhai et al. |
| 2016/0133571 | A1 | 5/2016 | Lee et al. |
| 2016/0343685 | A1 | 11/2016 | Lin |
| 2017/0110407 | A1 | 4/2017 | Chaware |
| 2017/0125379 | A1* | 5/2017 | Chen .................. H01L 21/4853 |
| 2017/0271307 | A1* | 9/2017 | Hiner .................. H01L 24/97 |
| 2017/0365580 | A1 | 12/2017 | Shih et al. |
| 2019/0051633 | A1 | 2/2019 | Bhagavat et al. |
| 2019/0341368 | A1* | 11/2019 | Hu .................. H01L 24/96 |
| 2019/0371778 | A1 | 12/2019 | Sankman et al. |

FOREIGN PATENT DOCUMENTS

| | | |
|---|---|---|
| EP | 3111475 | 1/2017 |
| KR | 1020130076749 | 7/2013 |
| KR | 20170126506 | 11/2017 |
| KR | 1020230011436 | 1/2023 |
| TW | 201719843 A | 6/2017 |
| TW | 201735276 A | 10/2017 |
| TW | 202011559 | 3/2020 |
| WO | WO 2016179159 | 11/2016 |
| WO | WO 2017099788 | 6/2017 |
| WO | WO 2018009145 | 1/2018 |
| WO | WO 2019236226 | 12/2019 |

OTHER PUBLICATIONS

Office Action from U.S. Appl. No. 17/587,657, mailed Jan. 4, 2023, 10 pgs.
Search Report from European Patent Application No. 19814378.6 mailed May 31, 2022, 2022, 36 pgs.
International Search Report and Written Opinion for International Patent Application PCT/US2019/030614 mailed Sep. 20, 2019, 10 pgs.
International Preliminary Report on Patentability for International Patent Application PCT/US2019/030614 mailed Dec. 17, 2020, 9 pgs.
Partial Supplementary ESR for European Patent Application No. 19814378.6 mailed Jan. 24, 2022, 39 pgs.
Extended European Search Report for European Patent Application No. 22171597.2 mailed Oct. 17, 2022, 14 pgs.
Office Action for Taiwan Patent Application No. 108114442 mailed Aug. 17, 2022, 14 pgs., with English translation.
Extended European Search Report for European Patent Application No. 21210501.9 mailed Jun. 22, 2022, 12 pgs.
Notice of Allowance for U.S. Appl. No. 17/587,657 mailed Jul. 17, 2023, 8 pgs.
Office Action for Taiwan Patent Application No. 111115241 mailed Apr. 21, 2023, 6 pgs.
Notice of Allowance for Taiwan Patent Application No. 112119616 mailed Nov. 17, 2023, 3 pgs.
Search Report for European Patent No. 23176064.6 mailed Jan. 24, 2024, 104 pgs.
Notice of Allowance for Taiwan Patent Application No. 111115241 mailed Sep. 5, 2023, 3 pgs.
Office Action from Korean Patent Application No. 10-2020-7027577, mailed Oct. 12, 2023, 17 pgs.
Office Action from Korean Patent Application No. 10-2022-7013121 mailed Oct. 13, 2023, 8 pgs.
Extended European Search Report for European Patent Application No. 23219820.0 mailed Jun. 12, 2024, 17 pgs.
Notice of Allowance from Korean Patent Application No. 10-2020-7027577 mailed Jun. 6, 2024, 4 pgs.
Final Office Action from Korean Patent Application No. 10-2022-7013121 mailed May 28, 2024, 10 pgs.
Office Action from Korean Patent Application No. 10-2023-7042877, mailed Mar. 29, 2024, 22 pgs.
Notice of Allowance for Taiwan Patent Application No. 112151263 mailed Feb. 1, 2024, 5 pgs.
Notice of Allowance from Korean Patent Application No. 10-2022-7013121 mailed Sep. 2, 2024, 4 pgs.

* cited by examiner

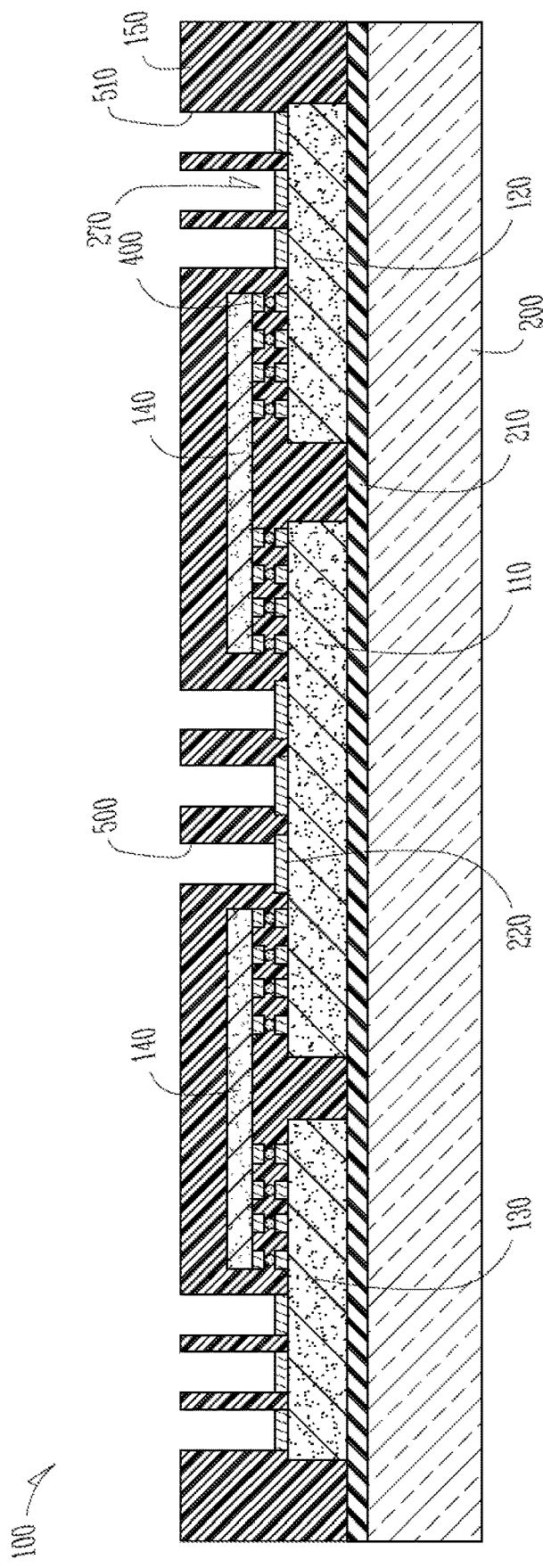
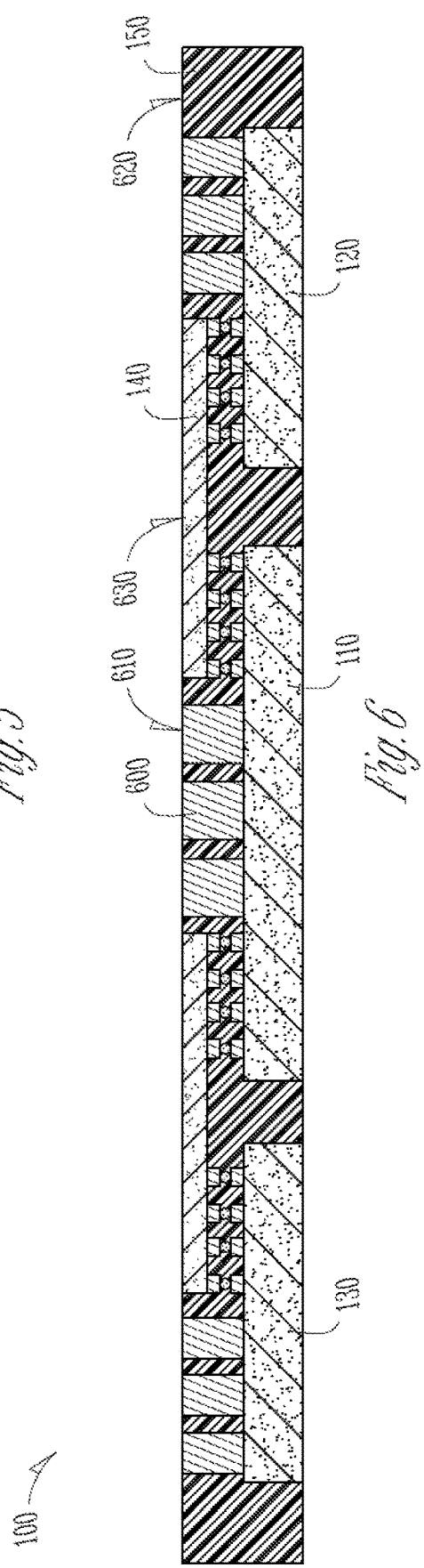
Fig. 5
Fig. 6

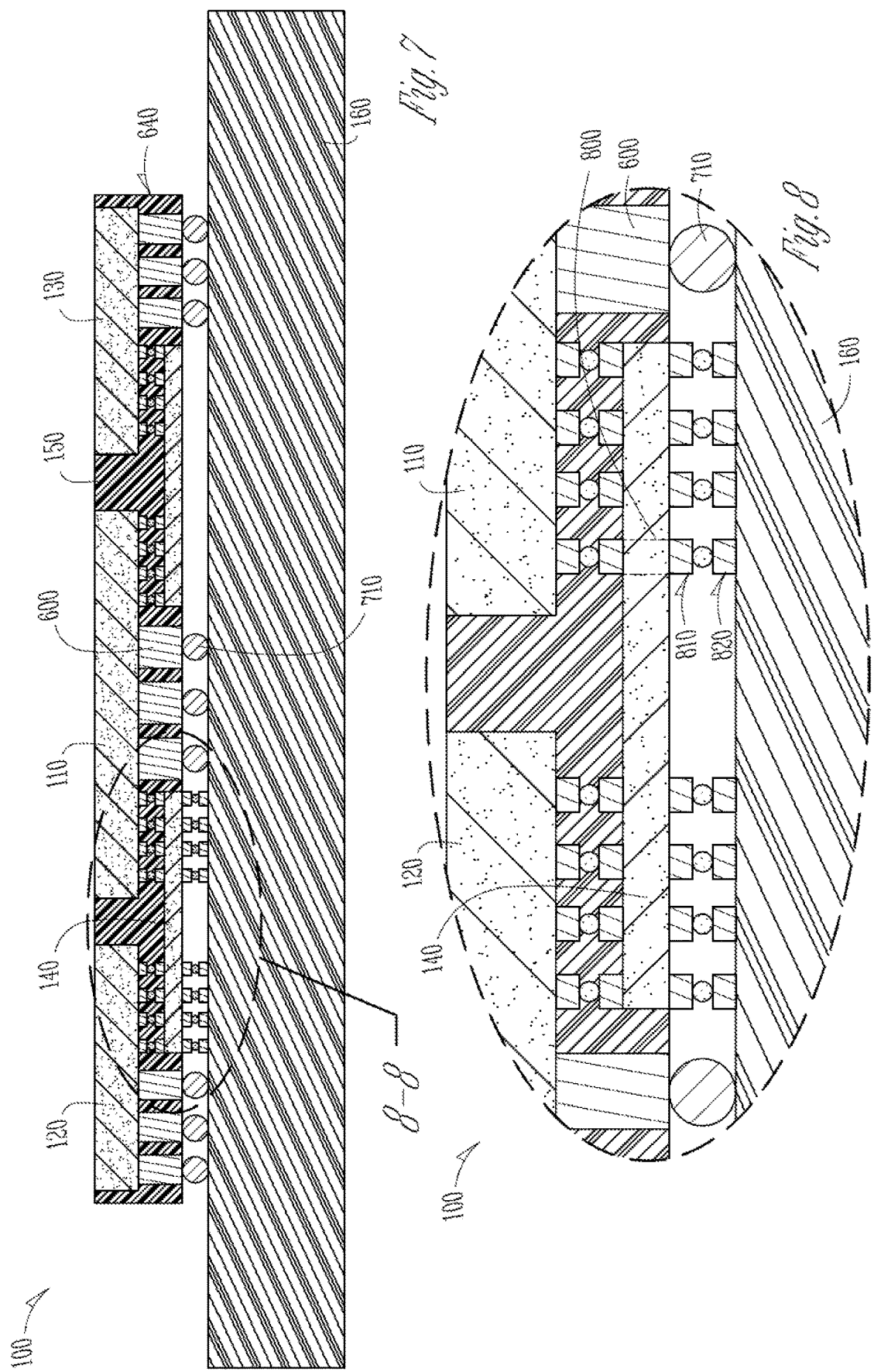

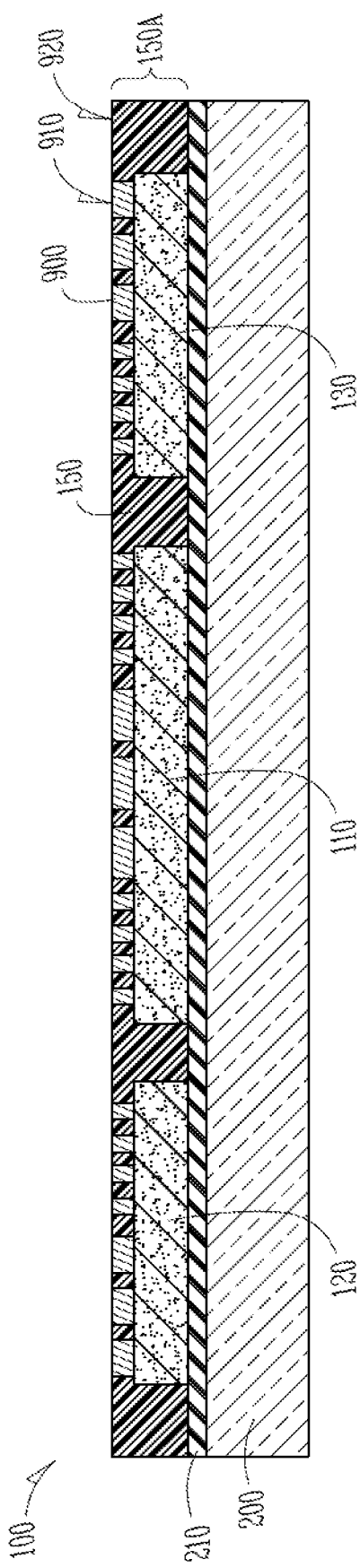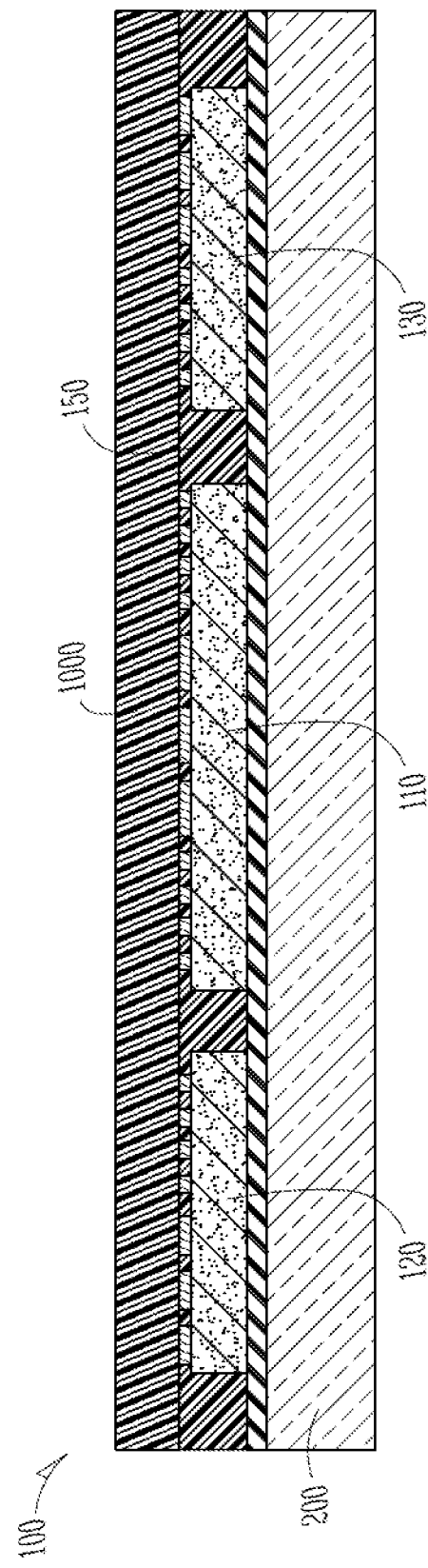

MULTI-CHIP PACKAGING

PRIORITY

This application is a continuation of U.S. patent application Ser. No. 17/587,657, filed Jan. 28, 2022, which is a continuation of U.S. patent application Ser. No. 16/892,698, filed Jun. 4, 2020, which is a continuation of U.S. patent application Ser. No. 15/996,870, filed Jun. 4, 2018, now U.S. Pat. No. 10,700,051, issued Jun. 30, 2020, which are incorporated by reference herein in their entirety.

BACKGROUND

Electronic devices may include a plurality of integrated circuits. The integrated circuits may be in electrical communication through one or more routing traces in a substrate. A die may be included in the substrate to help facilitate the electrical communication between the plurality of integrated circuits.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 5 illustrates a schematic view of the electronic device during a manufacturing operation, in accordance with an example of the present subject matter.

FIG. 6 illustrates a schematic view of the electronic device during a manufacturing operation, in accordance with an example of the present subject matter.

FIG. 7 illustrates a schematic view of the electronic device during a manufacturing operation, in accordance with an example of the present subject matter.

FIG. 8 illustrates a detailed schematic view of the electronic device 100 at the circle 8-8 of FIG. 7, in accordance with an example of the present subject matter.

FIG. 9 illustrates a schematic view of the electronic device during a manufacturing operation, in accordance with an example of the present subject matter.

FIG. 10 illustrates a schematic view of the electronic device during a manufacturing operation, in accordance with an example of the present subject matter.

DETAILED DESCRIPTION

The present inventors have recognized, among other things, that a problem to be solved may include improving the electrical communication between a plurality of die, such as by reducing the amount of signal loss or interference between the plurality of die. The present subject matter may help provide a solution to this problem, such as by providing an electronic device.

The electronic device may include a first die that may include a first set of die contacts. The electronic device may include a second die that may include a second set of die contacts. The electronic device may include a bridge interconnect that may include a first set of bridge contacts and may include a second set of bridge contacts. The first set of bridge contacts may be directly coupled to the first set of die contacts (e.g., with an interconnecting material, such as solder). The second set of bridge contacts may be directly coupled to the second set of die contacts (e.g., with solder). The bridge interconnect may help facilitate electrical communication between the first die and the second die.

The bridge interconnect may help reduce the need to include a cavity in a substrate to accommodate a die to electrically interconnect the first die with the second die. The bridge interconnect may help reduce signal loss and interference between the first die and second die, such as by reducing the length a signal travels between the first die and the second die. The bridge interconnect may thereby help reduce manufacturing costs associated with manufacturing the electronic device, such as by improving manufacturing process yields or reducing complexity of manufacturing processes associated with fabricating the electronic device.

This overview is intended to provide an overview of subject matter of the present patent application. It is not intended to provide an exclusive or exhaustive explanation of the invention. The detailed description is included to provide further information about the present patent application.

Figure 1:
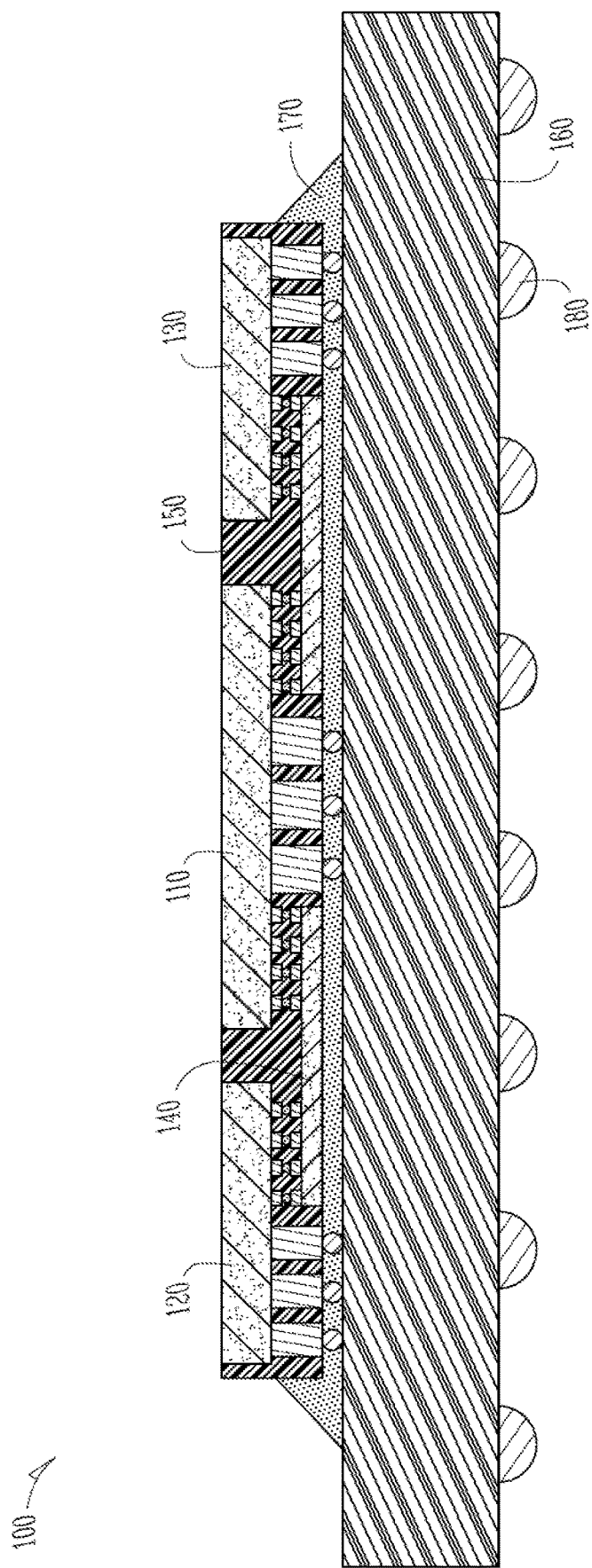
FIG. 1 illustrates a schematic view of one example of an electronic device, in accordance with an example of the present subject matter.

FIG. 1 illustrates a schematic view of one example of an electronic device 100. The electronic device may include a first die 110, may include a second die 120, and may include a third die 130. The first die 110, the second die 120, or the third die 130 may include a semiconductor material. The first die 110, the second die 120, and the third die 130 may include a processor die, a memory die, communication die (e.g., WiFi, Bluetooth, or cellular), or the like.

The electronic device 100 may include a bridge interconnect 140. The bridge interconnect 140 may help facilitate electrical communication within the electronic device 100, such as the electrical communication between the first die 110 and the second die 120. The bridge interconnect 140 may be coupled with the first die 110, the second die 120, and/or the third die 130, such as with an interconnection material (e.g., solder, electrically conductive epoxy, or the like) or with direct bonding (e.g., bonding that includes intimate contact) of the die and the bridge interconnect 140.

The electronic device 100 may include a molding material 150. The molding material 150 may be coupled with (e.g., form a direct interface with, or encapsulate) a portion of the first die 110, the second die 120, the third die 130, or may be coupled with a portion of the bridge interconnect 140. The molding material 150 may help provide mechanical support to the electronic device 100. The molding material 150 may include a filled polymer material. The molding material 150 may be deposited, formed, injected, spun, or the like and thereby coupled with components of the electronic device 100, such as the first die 110 or the bridge interconnect 140.

The electronic device 100 may include a substrate 160. The substrate 160 may include a dielectric material and may include a conductive material. The substrate 160 may include one or more routing layers that may be adapted to transmit electrical signals. The first die 110, the second die 120, and/or the third die 130 may be coupled to the substrate 160, such as with the interconnection material or with direct bonding of the die and the substrate 160. The substrate 160 may be coupled to (and in electrical communication with) additional structures (e.g., a motherboard, another substrate, a system on a chip, or the like). The electronic device 100 may include solder bumps 180 that may facilitate the coupling of the substrate 160 with the additional structures. The solder bumps 180 may be in electrical communication with the routing layers of the substrate 160.

An underfill material 170 may be positioned between the substrate 160 and the bridge interconnect 140. The underfill material 170 may be directly adjacent to, or form a direct interface with, the interconnection material. An oxide layer may be included between the underfill 170 (or the molding material 150) and other components of the electronic device 100, such as the interconnection material.

Figure 2:
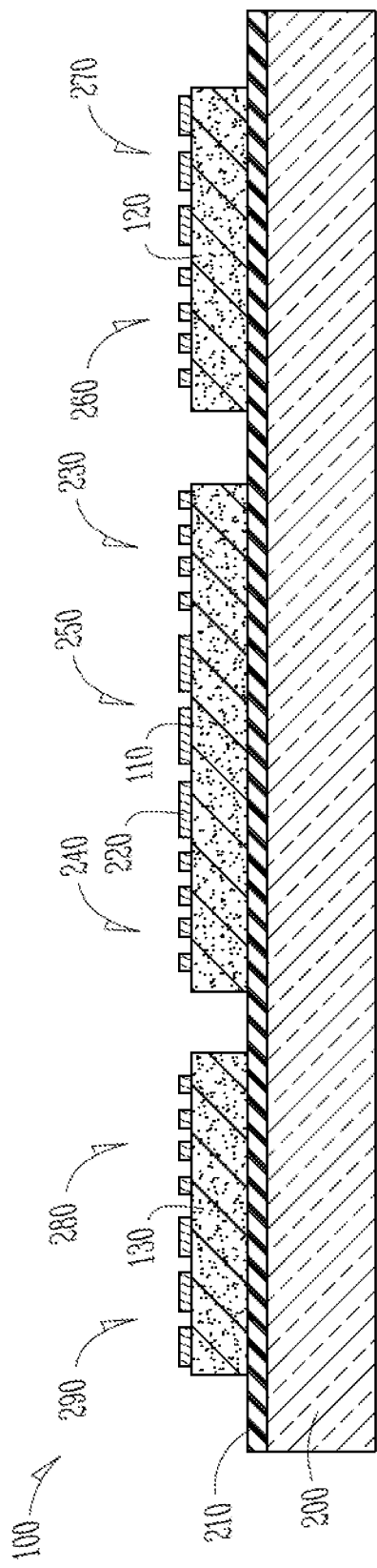
FIG. 2 illustrates a schematic view of the electronic device during a manufacturing operation, in accordance with an example of the present subject matter.

FIG. 2 illustrates a schematic view of the electronic device 100 during a manufacturing operation, in accordance with an example of the present subject matter. As described herein, the electronic device 100 may include the first die 110, the second die 120, and may include the third die 130. The first die 110, the second die 120, and the third die 130 may be positioned on a carrier 200. An active side of the first die 110, the second die 120, and the third die 130 may be coupled to the carrier 200. A non-active side of the first die 110, the second die 120, and the third die 130 may be coupled to the carrier 200.

The carrier 200 may help provide a foundation for performing manufacturing operations, such as manufacturing the electronic device 100. The carrier 200 may provide a planar surface. The carrier 200 may include a transparent material, such as glass, polymers, sapphire, or the like. The carrier 200 may include a plurality of through-holes. The plurality of through-holes may help couple the first die 110, the second die 120, and the third die 130 with the carrier 200. In an example, a vacuum force is generated on a first side of the carrier 200 and applied to the first die 110, the second die 120, and the third die 130 positioned on a second side of the carrier 200.

The first die 110, the second die 120, and the third die 130 may be coupled to (e.g., affixed to, or held together with) the carrier 200, such as with an adhesive 210. The adhesive 210 may include a transparent material. The adhesive 210 may have a thickness within a range of 10 to 20 micrometers. The adhesive 210 may be adapted to release (e.g., the bonding forces between the first die 110 and the carrier 200 may decrease) in response to heat or light (e.g., UV or visible light). The adhesive 210 may be positioned between the active side of the first die 110, the second die 120, and the third die 130; and the carrier 210.

The first die 110 may include a contact 220. The contact 220 may be in electrical communication with circuitry of a die (e.g., the first die 110), and may allow for the interconnection of the die with external devices or structures, including (but not limited to) the bridge interconnect 140. The contact 220 may include a conductive pad, a conductive bump, a conductive pin, a conductive pillar, or the like.

The first die 110 may include a first set of die contacts 230, a second set of die contacts 240, and may include a third set of die contacts 250. The second die 120 may include a fourth set of die contacts 260, and may include a fifth set of die contacts 270. The third die 110 may include a sixth set of die contacts 280 and may include a seventh set of die contacts 290. The die contacts (e.g., the first set of die contacts 230 and the fifth set of contacts 270) may extend from a die (e.g., the first die 110) and may have the same height, or may have varying heights.

Figure 3:
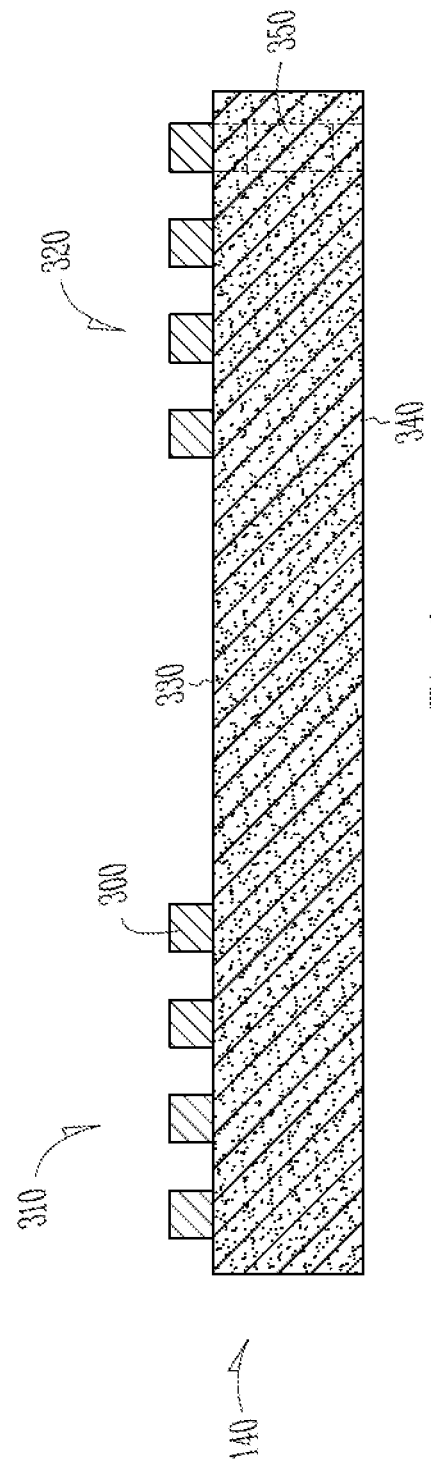
FIG. 3 illustrates a schematic view of a bridge interconnect.

FIG. 3 illustrates a schematic view of the bridge interconnect 140. As discussed in greater detail herein, the bridge interconnect 140 may help facilitate electrical communication between the first die 110, the second die 120, and/or the third die 130. The bridge interconnect 140 may include a semiconductor die. The bridge interconnect 140 may process electrical signals transmitted within the bridge interconnect 140. The bridge interconnect 140 may include an organic package.

The bridge interconnect 140 may include a first set of bridge contacts 310 and may include a second set of bridge contacts 320. The first set of bridge contacts 310 may include a bump 300. The bump 300 may be in electrical communication with circuitry of the bridge interconnect 140 and the bump 300 may extend from the bridge interconnect 140.

The bridge interconnect 140 may include a bridge via 350. The bridge via 350 may include a through-silicon via. The bridge via 350 may help transmit electrical signals through the bridge interconnect 140. The bridge via 350 may electrically interconnect a first side 330 of the bridge interconnect 140 with a second side 340 of the bridge interconnect 140. The bridge interconnect 140 may include contacts (e.g., the first set of bridge contacts 310) on the first side 330 or the second side 340 of the bridge interconnect 140. For example, the bridge interconnect 140 may include a first pad on the first side 330 of the bridge interconnect 140. The bridge interconnect 140 may include a second pad on the second side 340 of the bridge interconnect 140. The bump 300 may be coupled to the first pad or the second pad. The bridge via 330 may be in electrical communication with the bump 300.

Figure 4:
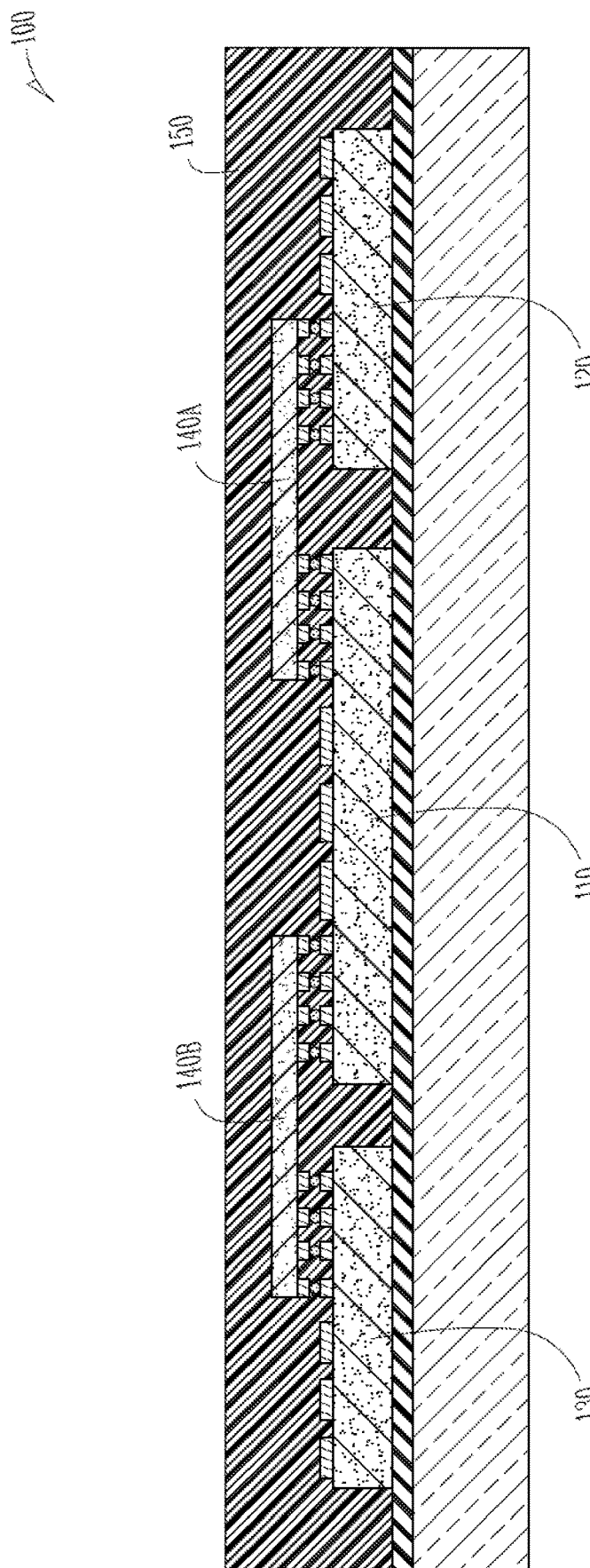
FIG. 4 illustrates a schematic view of the electronic device during a manufacturing operation, in accordance with an example of the present subject matter.

FIG. 4 illustrates a schematic view of the electronic device 100 during a manufacturing operation, in accordance with an example of the present subject matter. The bridge interconnect 140 may help facilitate electrical communication within the electronic device 100, such as the electrical communication between the first die 110 and the third die 130. The bridge interconnect 140 may help establish an electrical communication pathway between the first die 110, the second die 120, the third die 130, and/or additional die of the electronic device 100. The bridge interconnect 140 may be sized and shaped to overlap a portion of the first die 110 and the second die 120 (or the first die 110 and the third die 130).

The bridge interconnect 140 may be directly coupled to the first die 110, the second die 120, the third die 130, or additional die. Directly coupling the bridge interconnect 140 may include directly bonding the bridge interconnect 140 with the first die 110, the second die 120, and/or the third die 130. In an example, the bridge interconnect 140 includes a semiconductor die, and the die of the bridge interconnect 140 is directly coupled to the first die 110. The bridge interconnect 140 may be directly coupled to the first die 110 with an interconnection material 400 (e.g., solder, electrically conductive epoxy, or the like).

Because the bridge interconnect 140 is directly coupled with the die of the electronic device 100 (e.g., the first die 110), the bridge interconnect 140 may help reduce RC loss or may help reduce interconnect propagation delay. In an example, the bridge interconnect 140 may help reduce a length that an electrical signal must travel between the first die 110 and the second die 120. Additionally, the bridge interconnect 140 may allow for the electrical signals to be transmitted at a greater rate than, for instance, by transmitting the electrical signals through routing traces in a substrate.

Therefore, by directly coupling the bridge interconnect 140 with the first die 110 and the second die 120, the electrical signals that may be transmitted between the first die 110 and the second die 110 may experience a reduced amount of RC loss or interconnect propagation delay. The bridge interconnect 140 may help improve performance of the electronic device 100 and may help simplify the manufacturing process to manufacture the electronic device 100.

Referring again to FIG. 4, the bridge contacts of the bridge interconnect 140 (for instance, the first set of bridge contacts 310 of FIG. 3) may be directly coupled to the die contacts of the first die 110, the second die 110, the third die 130, and/or additional die (e.g., the first set of die contacts 230 and the fourth set of die contacts 260 of FIG. 2). In an example, and as shown in FIG. 4, bridge contacts of a first bridge interconnect 140A may be directly coupled to bridge contacts the first die 110 and the second die 120 (e.g., with an interconnect material, such as solder).

A second bridge interconnect 140B may be directly coupled to the first die 110 and the third die 130. The first bridge interconnect 140A may help facilitate the electrical communication of the first die 110 and the second die 120. The second bridge interconnect 140B may help facilitate the electrical communication between the first die 110 and third die 130. The first bridge interconnect 140A and the second bridge interconnect 140B may help facilitate the electrical communication between the second die 120 and the third die 130.

In another example, the bridge contacts of the first bridge interconnect 140A may be directly coupled to the die contacts of the first die 110, the second die 120, and the third die 130. The first bridge interconnect 140A may help facilitate the electrical communication between the first die 110, the second die 120, and the third die 130. In yet another example, the first die 110, the second die, 120, the third die 130, and a fourth die are positioned proximate each other (e.g., arranged in a grid). The bridge contacts of the bridge interconnect 140A may be positioned proximate the bridge contacts of the first die 110, the second die 120, the third die 130, and the fourth die (e.g., at the four corners of the die). The bridge interconnect 140A may be directly coupled to the first die 110, the second die 120, the third die 130, and the fourth die; and may help facilitate the electrical communication between one or more of the first die 110, the second die 120, the third die 130, and the fourth die. Additional arrangements or configurations of the first die 110, the second die 120, the third die 130, and/or additional die; and bridge interconnects (e.g., the first bridge interconnect 140A and/or the second bridge interconnect 140B) are possible and contemplated as being within the scope of the present subject matter.

The molding material 150 may be coupled to (e.g., deposited on, formed on, or the like) the electronic device 100. The molding material 150 may be coupled to the first die 110, the second die 120, the third die 130, the bridge interconnect 140, and the interconnections of the electronic device 100. The molding material 150 may provide mechanical strength to the electronic device 100 and may improve the resilience of the interconnections of the electronic device 100.

FIG. 5 illustrates a schematic view of the electronic device 100 during a manufacturing operation, in accordance with an example of the present subject matter. A first opening 500 or a second opening 510 may be formed in (e.g., defined in) the molding material 100, such as with a laser ablation process. The first opening 500 may be in communication with the contact 220 of the first die 110. The second opening 510 may be in communication with the fifth set of die contacts 270.

A fiducial mark may be used to align the first opening 500 with, for example, the contact 220. As described herein, the carrier 200 may include a transparent material. The carrier 200 may include one or more fiducial marks (a dot, a mark, a line, a geometric shape, an amorphous shape, or the like) that are used as a reference point to determine a location of components of the electronic device 100 with respect to the carrier 200. For example, a surface of the carrier 200 may include a fiducial line that may be used to locate a position of the first die 110 with respect to the carrier 200. The carrier 200 may be sized and shape to include a plurality of die coupled to the surface of the carrier 200. The first die 110, the second die 120, and the third die 130 may be couple to the carrier 200 as a first set of die. The carrier 200 may include fiducial marks that outline the area proximate the first die 110, the second die 120, and the third die 130. A second set of die may be coupled to the carrier 200. For example, the second set of die may be coupled to the carrier 200 in an adjacent unit cell to the first set of die, and the fiducial marks included in the carrier 200 may be used to identify a location of the first set of die or a location of the second set of die, with respect to the carrier 200.

Similarly, the first die 110, the second die 120, or the third die 130 may include one or more fiducial marks. In an example, the first die 110 may include a fiducial mark on the active side of the first die 110. The carrier 200 and the adhesive 210 may be transparent. The fiducial mark on the active side of the first die 110 may be observed through the carrier 200 and the adhesive 210. The fiducial mark on the active side of the first die 110 may be used as a reference point in other manufacturing processes for the electronic device 100, including (but not limited to) ablating the molding material 150 to form the first opening 500 or the second opening 510.

In another example, the one or more fiducial marks of the carrier 200 may be positioned on a first surface of the carrier 200, and the one or more fiducial marks may be observed through a second side of the carrier 200. The one or more fiducial marks described herein may be used as a reference point to determine a position of components of the electronic device 100, including (but not limited to), the third die 110, the contact 220, or the fifth set of die contacts 270.

Referring again to FIG. 5, a conductive material (e.g., copper, aluminum, or the like) may be coupled to the electronic device 100, including (but not limited to) the molding material 150 or a contact (for instance, the contact 220). In an example, a conductive material may be deposited onto the electronic device 100, such as with a plating operation (e.g., electrolytic plating or the like). The conductive material may fill the first opening 500 and the second opening 510. The coupling of the conductive material with the electronic device 100 may form a layer of conductive material that covers the molding material 150.

FIG. 6 illustrates a schematic view of the electronic device 100 during a manufacturing operation, in accordance with an example of the present subject matter. As described herein, conductive material may be coupled to the electronic device 100. The conductive material may fill the first opening 500 and may form a layer of conductive material that covers the molding material 150. As described in greater detail herein, the conductive material that fills the opening 500 (or the opening 510) may provide a die via 600.

The layer of conductive material (e.g., covering the molding material 150) may be removed from the electronic device 100, such as with a grinding operation. The molding material 150 and the conductive material may be simultaneously removed and, as shown in FIG. 6, a first surface 610 of the die via 600 may be coplanar with a second surface 620 of the molding material 150.

As described herein, the conductive material may be coupled with a contact (for instance, the contact 220 of FIG. 5) of the electronic device 100. The die via 600 may be coupled to the contact. The die via 600 may help facilitate the electrical communication of the electronic device 100. In an example, the die via 600 provides an electrical communication pathway through the molding material 150 for the first die 110. The electronic device 100 may include a plurality of die vias, including the die via 600.

Referring again to FIG. 6, a portion of the molding material 150 may be removed from the electronic device 100, such as with a grinding operation. A portion of the bridge interconnect 140 may be removed from the electronic device 100. The second surface 620 of the molding material 150 may be coplanar with a third surface 630 of the bridge interconnect 140, and may help reduce a height of the electronic device 100. The third surface 630 of the bridge interconnect 140 may be coplanar with the first surface 610 of the die via 600 (e.g., a surface of the die via 600), and may help reduce a height of the electronic device 100.

The first die 110, the second die 120, and the third die 130 may be singulated as a unit 640 from the molding material 150. As described herein, one or more sets of die (for instance the first set of die described with reference to FIG. 5) may be coupled to the carrier 200 (shown in FIG. 5). To remove the one or more set of die from the carrier 200, the molding material 150 proximate the one or more sets of die may be removed (e.g., cut or ablated, for instance with a laser). For example, the molding material 150 proximate a periphery of an area occupied by the first die 110, the second die 120, and the third die 130 may be removed; and the first die 110, the second die 120, and the third die 130 may be separated as the unit 260 from a carrier (for instance the carrier 200 of FIG. 5). As described in greater detail herein, the unit 640 may be used in additional manufacturing operations for the electronic device 100.

FIG. 7 illustrates a schematic view of the electronic device 100 during a manufacturing operation, in accordance with an example of the present subject matter. The electronic device 100 may include a substrate 150. As described herein, the substrate 160 may include one or more routing layers that may be adapted to transmit electrical signals. The substrate 160 may help facilitate the electrical communication of the first die 110, the second die 120, and/or the third die 130.

In an example, the first die 110, the second die 120, and the third die 130 may be coupled to the substrate 150. For instance, the unit 640 may be coupled to the substrate 160. The substrate 160 may include substrate contacts (e.g., pads, bumps, pillars, pins, sockets, or the like) that may be in electrical communication with the routing layers of the substrate 160. The die via 600 that may be included in the electronic device 100 may be coupled to the substrate contacts, for instance with solder bumps 710. Electrical signals may be transmitted from the first die 110, the second die 120, and/or the third die 130; through the die via 600 and the solder bumps 710; and may propagate through the substrate 160 (and, for example, propagate through the solder bumps 180 of FIG. 1).

FIG. 8 illustrates a detailed schematic view of the electronic device 100 at the circle 8-8 of FIG. 7, in accordance with an example of the present subject matter. As described herein, the first die 110, the second die 120, or the third die 130 may be coupled to the substrate 160. In some examples, the bridge interconnect 140 may be coupled to the substrate 160; and the bridge interconnect 140 may be in electrical communication with the substrate 160. The bridge interconnect 140 may be positioned between the die of the electronic device (e.g., the first die 110) and the substrate 160.

The bridge interconnect 140 may be coupled to the substrate 140. For instance, the bridge interconnect 140 may include bridge contacts on the first side 330 (shown in FIG. 3) of the bridge interconnect 140 (e.g., the first set of bridge contacts 310 shown in FIG. 3). The bridge interconnect 140 may include bridge contacts on the second side of the bridge interconnect 140. For example, the bridge interconnect 140 may include a third set of bridge contacts 810 on the second side of the bridge interconnect 140. The third set of bridge contacts 810 may be coupled to a first set of substrate contacts 820 of the substrate 160. The coupling of the bridge contacts (e.g., the third set of bridge contacts 810) with the substrate contacts (e.g., the first set of substrate contacts 820) may help facilitate the electrical communication of the bridge interconnect 140 and the substrate 160.

The bridge interconnect 140 may include the bridge via 800 (or the bridge via 350 shown in FIG. 3). The bridge via 800 may help facilitate the electrical communication between the die of the electronic device 100 (e.g., first die 110) and the substrate 160. The bridge via 800 may be a through-silicon via. The bridge via 800 may electrically interconnect a first side of the bridge interconnect (e.g., the first side 330 shown in FIG. 3) with a second side of the bridge interconnect (e.g., the second side 340 shown in FIG. 3). The coupling of the bridge interconnect 140 with the substrate may allow for electrical signals to be transmitted from a die of the electronic device (e.g., the second die 120), through the bridge via 800, and transmitted to the substrate 160 (e.g., by propagating the signals through the first set of substrate contacts 820).

Coupling the bridge interconnect 140 with substrate 160 may help increase the density of electrical interconnections in the electronic device. Coupling the bridge interconnect 140 with the substrate 160 may provide additional electrical communication pathways between the first die 110 and the substrate 110. For example, an electrical signal may be transmitted between the first die 110 and the substrate 160 within a footprint of the bridge interconnect 140. Increasing the density of the electrical interconnections in the electronic device 100 may help increase the performance of the electronic device; or may allow for dimensions of the electronic device 100 to be reduced.

Additionally, coupling the unit 640 (shown in FIGS. 6 and 7) to the substrate 160 may help decrease the difficulty of manufacturing the electronic device 100 and may help reduce losses in the manufacturing operations for the electronic device 100.

In an example, the bridge interconnect 140 may include bridge interconnects (e.g., the first set of bridge interconnects 310 shown in FIG. 3) that have a first pitch. The first die 110 may include die contacts that have the first pitch (e.g., the second set of die contacts 240 shown in FIG. 2); and the first die 110 may include die contacts that have a second pitch (e.g., the third set of die contacts 250 shown in FIG. 2). The first pitch may be different than the second pitch. The structures of the electronic device 100 that have the first pitch may be electrically interconnected in a first operation. The structures of the electronic device 100 that have the second pitch may be electrically interconnected in a second operation. Separating the interconnection of the structures with the first pitch and the second pitch into the first operation and the second operation may simplify the manufacturing operations for the electronic device 100 and may help decrease waste (e.g., yield losses) associated with manufacturing operations for the electronic device 100.

FIG. 9 illustrates a schematic view of the electronic device 100 during a manufacturing operation, in accordance with an example of the present subject matter. One or more die, including (but not limited to); the first die 110, the second die 120, and the third die 130 may be coupled to the carrier 200 (e.g., with the adhesive layer 210). A first layer 150A of the molding material 150 may be coupled to the first die 110, the second die 120, and the third die 130. The electronic device 100 may include a die contact 900 (e.g., included in the third die 130), and the die contact 900 may include a die contact surface 910. The die contact surface 910 may be coplanar with a molding surface 920 of the first layer 150A of molding material 150.

FIG. 10 illustrates a schematic view of the electronic device 100 during a manufacturing operation, in accordance with an example of the present subject matter. A layer 1000 may be coupled to the electronic device 100. For example, the layer 1000 may be coupled to the die contact surface 910 and the molding surface 920. A seam (e.g., difference in metal grain structure) may be detectable (e.g., through non-destructive evaluation) at the interface of the conductive material and the die contact surface 910. The layer 1000 may include a conductive material seed layer (e.g., copper) coupled to the electronic device 100. The layer 1000 may include a laminate material. The laminate material may include (but is not limited to) dry film resist. The laminate material may be used in a manufacturing operation (e.g., photolithography or the like) and may be photosensitive. The layer 1000 may harden (or soften) when exposed to light (e.g., UV light).

Figure 11:
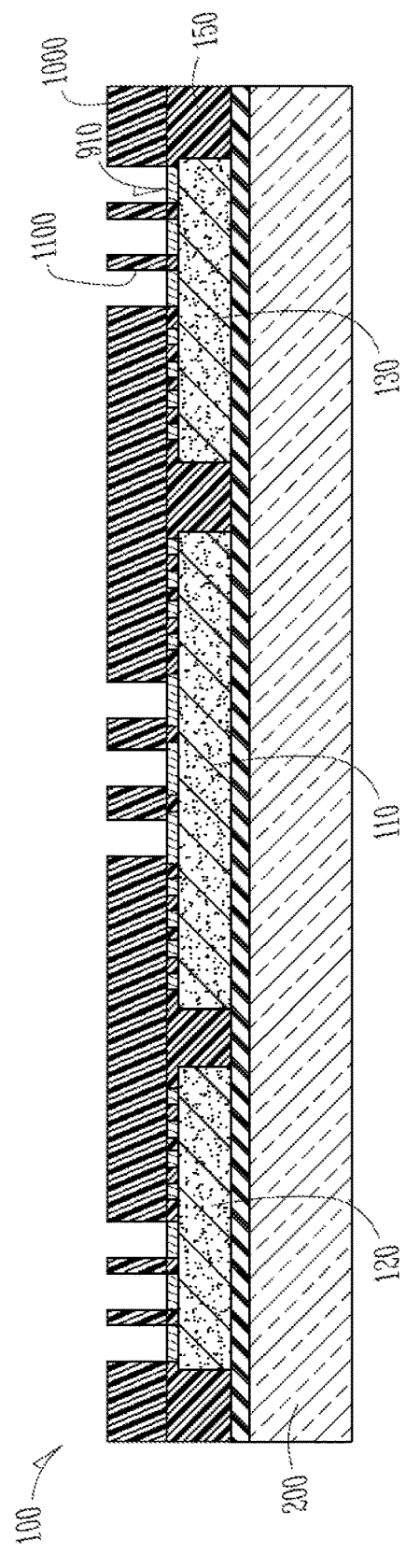
FIG. 11 illustrates a schematic view of the electronic device during a manufacturing operation, in accordance with an example of the present subject matter.

FIG. 11 illustrates a schematic view of the electronic device during a manufacturing operation, in accordance with an example of the present subject matter. As described herein, the layer 1000 may be photosensitive. An opening 1100 may be formed in the layer 1000. The opening 1100 may be in communication with the die contact surface 910.

In an example, a mask may be applied over the layer 1000, and the mask may prevent portions of the layer 1000 from being exposed to light. For example, the mask may block the layer 1000 from absorbing light in the area above the die contact surface 910. The unmasked portions of the layer 1000 that absorb light may harden. The masked portion of the layer 1000 may be removed (e.g., with a solvent), and the unmasked (or hardened) portions of the layer 1000 remain. The opening 1100 may be defined in the layer 1000. For instance, the opening 1100 may be formed during removal of the unmasked portions of the layer 1000 from the electronic device 100.

A conductive material may be coupled to the electronic device 100, and the conductive material may fill the opening 1100. The conductive material that fills the opening 1100 may create a conductive pillar (e.g., the conductive pillar 1200 shown in FIG. 12), and the conductive pillar may extend from a surface of a die (e.g., the first die 110). The conductive material may be coupled to the die contact surface 910. The layer 1000 may be removed (e.g., dissolved) from the electronic device 100, and the conductive material may be substantially unaffected by the removal operation. The conductive pillar may include the conductive material that is coupled to the die contact surface 910 after the removal of the layer 1000.

In an example, copper is plated into the opening 1100 and is coupled with the die contact surface 910. The copper may be coplanar with a top surface of the layer 1000. The layer 1000 may be removed (e.g., with a solvent) and the copper that filled the opening 1100 will remain coupled to the die contact surface 910.

Figure 12:
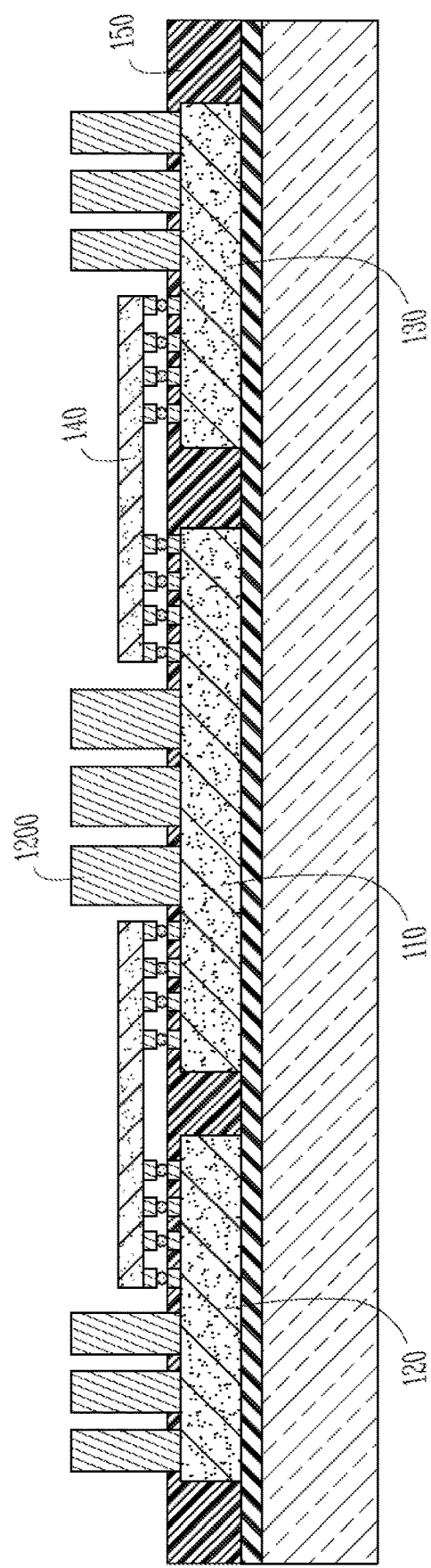
FIG. 12 illustrates a schematic view of the electronic device during a manufacturing operation, in accordance with an example of the present subject matter.

FIG. 12 illustrates a schematic view of the electronic device 100 during a manufacturing operation, in accordance with an example of the present subject matter. The electronic device 100 may include a conductive pillar 1200. The electronic device may include a plurality of conductive pillars that includes the conductive pillar 1200. The conductive pillar 1200 may include conductive material (e.g., copper) that may be coupled to a die contact surface (e.g., the die contact surface 910 of FIG. 11) of a die (e.g., the second die 120). The conductive pillar 1200 may help facilitate the electrical communication of the die with external structures. For example, the conductive pillar 1200 may be coupled to a substrate (e.g., the substrate 160 shown in FIG. 1), and the conductive pillar 1200 may help facilitate the electrical communication of the die (e.g., the first die 110) with the substrate.

As discussed herein, the electronic device 100 may include the bridge interconnect 140. The bridge interconnect 140 may be coupled to die contacts (e.g., the first the electronic device 100 (e.g., first set of die contacts 230 and the fourth set of die contacts 260 shown in FIG. 2), and the bridge interconnect may facilitate the electrical communication of the electronic device 100, including (but not limited to) the electrical communication between the first die 110 and the second die 120. In some examples, the bridge interconnect 140 may be coupled to the electronic device 100 after the layer 1000 (shown in FIGS. 10-11) has been removed from the electronic device 100. The bridge interconnect 140 may be coplanar with a portion of the conductive pillar 1200. The conductive pillar 1200 may have a first length and may extend from a die (e.g., the first die 110). The conductive pillar 1200 may extend beyond the bridge interconnect 140 that is coupled to the electronic device 100.

Figures 13, 14:
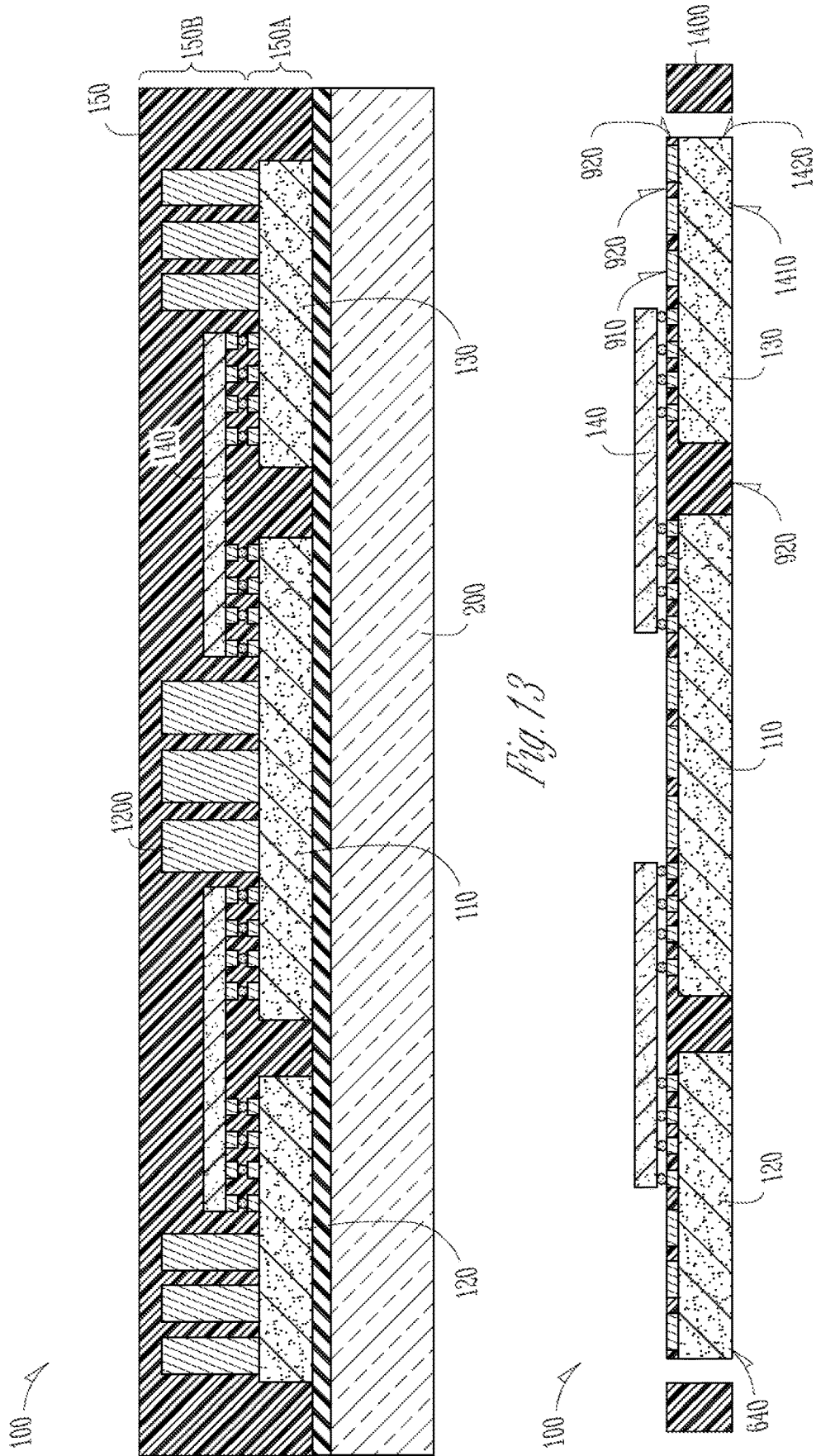
FIG. 13 illustrates a schematic view of the electronic device during a manufacturing operation, in accordance with an example of the present subject matter.
FIG. 14 illustrates a schematic view of the electronic device during a manufacturing operation, in accordance with an example of the present subject matter.

FIG. 13 illustrates a schematic view of the electronic device 100 during a manufacturing operation, in accordance with an example of the present subject matter. As discussed herein, the electronic device 100 may include the molding material 150. The molding material 150 may help provide mechanical strength to the electronic device 100. The molding material 150 may be coupled to the first die 110, the second die 120, the third die 130, the bridge interconnect 140, and may be coupled to the conductive pillar 1200.

As described herein, the electronic device 100 may include the first layer 150A of the molding material 150. The electronic device 100 may include a second layer 150B of the molding material 150. The first layer 150A may be coupled to the electronic device 100 in a first operation, and the second layer 150B may be coupled to the electronic device 100 in a second operation. A seam (e.g., a discontinuity in molecular structure) may be detectable at an interface of the first layer 150A and the second layer 150B (e.g., through sectioning of, or non-destructive evaluation of, the electronic device 100).

In an example, the electronic device includes a plurality of conductive pillars, and the molding material 150 may be positioned between the plurality of conductive pillars. The molding material 150 may be positioned between the conductive pillar 1200 and the bridge interconnect 140. The molding material may be positioned between the bridge interconnect 140 and a die (e.g., the first die 110, the second die 120, or the third die 130). The molding material 150 may be positioned between die contacts (e.g., the first set of die contacts 230 shown in FIG. 2) and bridge contacts (e.g., the first set of bridge contacts 310).

A portion of the molding material may be removed (e.g., in a grinding operation) and a portion of the conductive pillar 1200 may be removed. The electronic device 100 may be removed from the carrier 200 as a unit (e.g., the unit 640 of FIGS. 6-7) and may be used in other manufacturing operations. Portions of the molding material 150 may be removed from a periphery of the electronic device 100.

FIG. 14 illustrates a schematic view of the electronic device 100 during a manufacturing operation, in accordance with an example of the present subject matter. As described herein, the electronic device 100 may include the first die 110, the second die 120, and the third die 130 that may include the die contact 220. The molding material 150 may be coupled to the first die 110, the second die 120, and the third die 130. The die contact surface 910 of the die contact 220 may be coplanar with the molding surface 920 of the molding material 150. The bridge interconnect 140 may be coupled to the electronic device 100 (e.g., coupled to the first die 110 and the second die 120).

The electronic device 100 may be separated from a carrier (e.g., the carrier 200 of FIG. 9) as the unit 640. The unit 640 may include one or more die (e.g., the second die 120 and the third die 130). Excess portions 1400 of the molding material 150 may be removed (e.g., cut, ablated, or the like) from the unit 640. The molding surface 920 may be coplanar with a first surface 1410 (e.g., active side) of a die (e.g., the third die 130). The molding surface 920 may be coplanar with a second surface 1420 of the die. The first side 1410 of the die may be perpendicular to the second side of the die.

Figure 15:
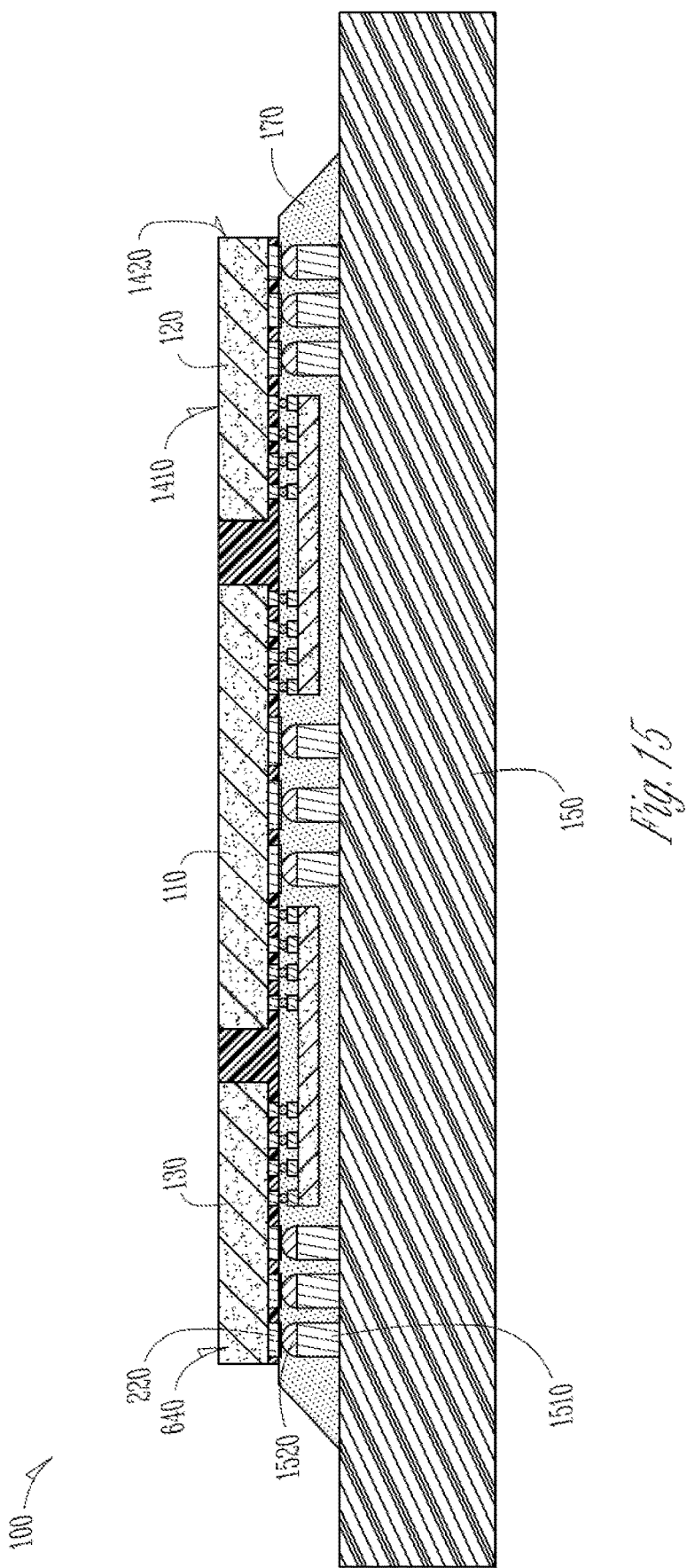
FIG. 15 illustrates a schematic view of the electronic device during a manufacturing operation, in accordance with an example of the present subject matter.

FIG. 15 illustrates a schematic view of the electronic device 100 during a manufacturing operation, in accordance with an example of the present subject matter. The substrate 160 may include a conductive post 1510, and the conductive post 1510 may extend from a surface of the substrate 160 (e.g., extend a first height). The unit 640 may be coupled to the substrate 160. For instance, a solder ball 1520 may be positioned between the die contact 220 and the conductive post 1510. The bridge interconnect 140 may be coplanar with a portion of the conductive post 1510. The bridge interconnect 140 may be positioned between the substrate 160 and a die (e.g., the first die 110). In an example, the electronic device 100 includes a first bridge interconnect (e.g., the bridge interconnect 140) and a second bridge interconnect; and the first bridge interconnect may be coplanar with the second bridge interconnect.

As described herein, the electronic device 100 may include the underfill material 170. The underfill material 170 may fill a space between the unit 640 and the substrate 160. In some examples, the underfill material 170 has a lower viscosity than the molding material 150. The underfill material 170 may be adapted to flow into spaces that the molding material 150 is unable to flow into (e.g., between the unit 640 and the substrate 160). The underfill material 170 may be coupled to the unit 640, and may be coupled to the substrate 160. The underfill material 170 may be positioned between the molding material 150 and the bridge interconnect 140. The underfill material 170 may be positioned between the bridge contacts (e.g., the first set of bridge contacts 310 of FIG. 3) of the bridge interconnect 140. The underfill material 170 may be positioned between the bridge interconnect 140 and the conductive pillar 1510. In an example, the bridge interconnect 140 may be positioned proximate the conductive pillar 1510, and the underfill material 170 may fill a space between the bridge interconnect 140 and the conductive pillar 1510. The underfill material 170 may be coupled to the first die 110, the second die 120, or the third die 130.

Figure 16:
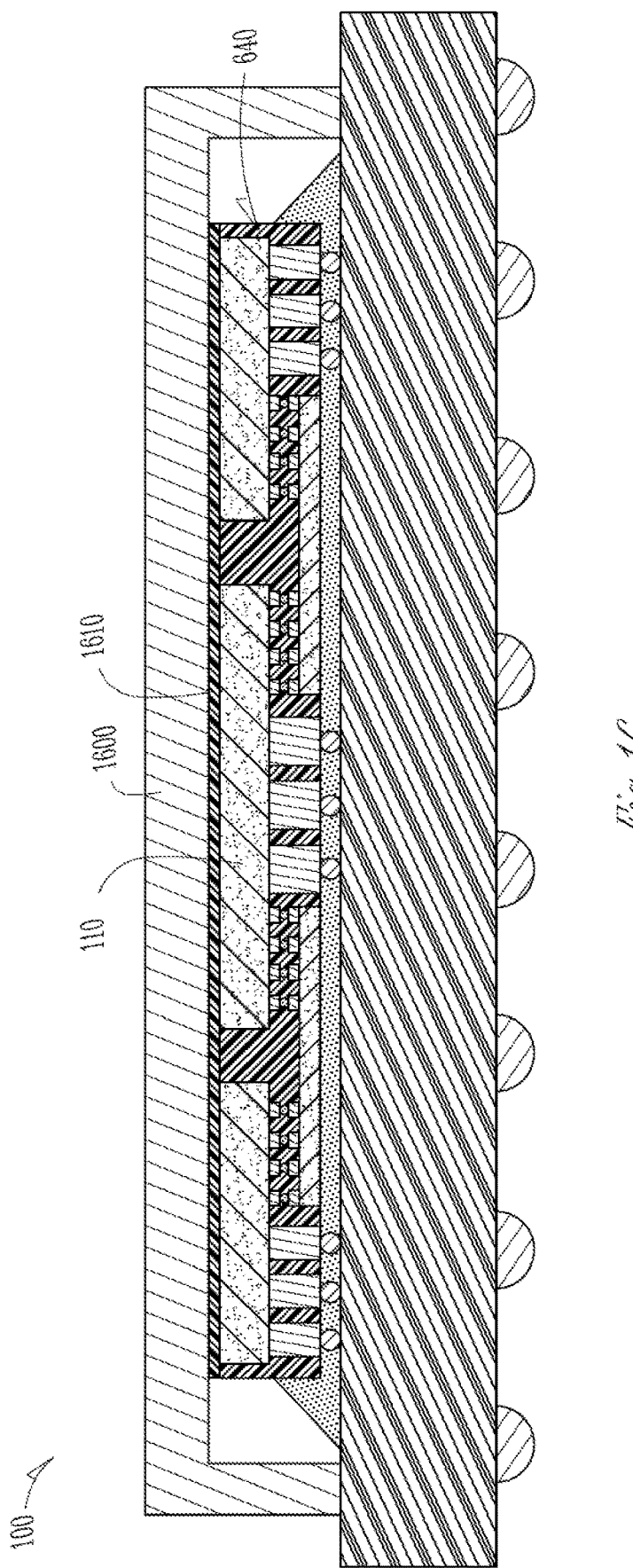
FIG. 16 illustrates a schematic view of the electronic device during a manufacturing operation, in accordance with an example of the present subject matter.

FIG. 16 illustrates a schematic view of the electronic device 100 during a manufacturing operation, in accordance with an example of the present subject matter. The electronic device 100 may include a heat sink, including (but not limited to) an integrated heat spreader 1600. The integrated heat spreader 1600 may be positioned proximate the unit 640. An interface material 1610 (e.g., thermal interface material or the like) may be positioned between the unit 640 and the integrated heat spreader 1600, and may improve heat transfer from a die (e.g., the first die 110) to the integrated heat spreader 1600. The interface material 1610 may be positioned between the first side 1410 (shown in FIG. 15) of a die (e.g., the third die 110) and the integrated heat spreader 1600.

Figure 17:
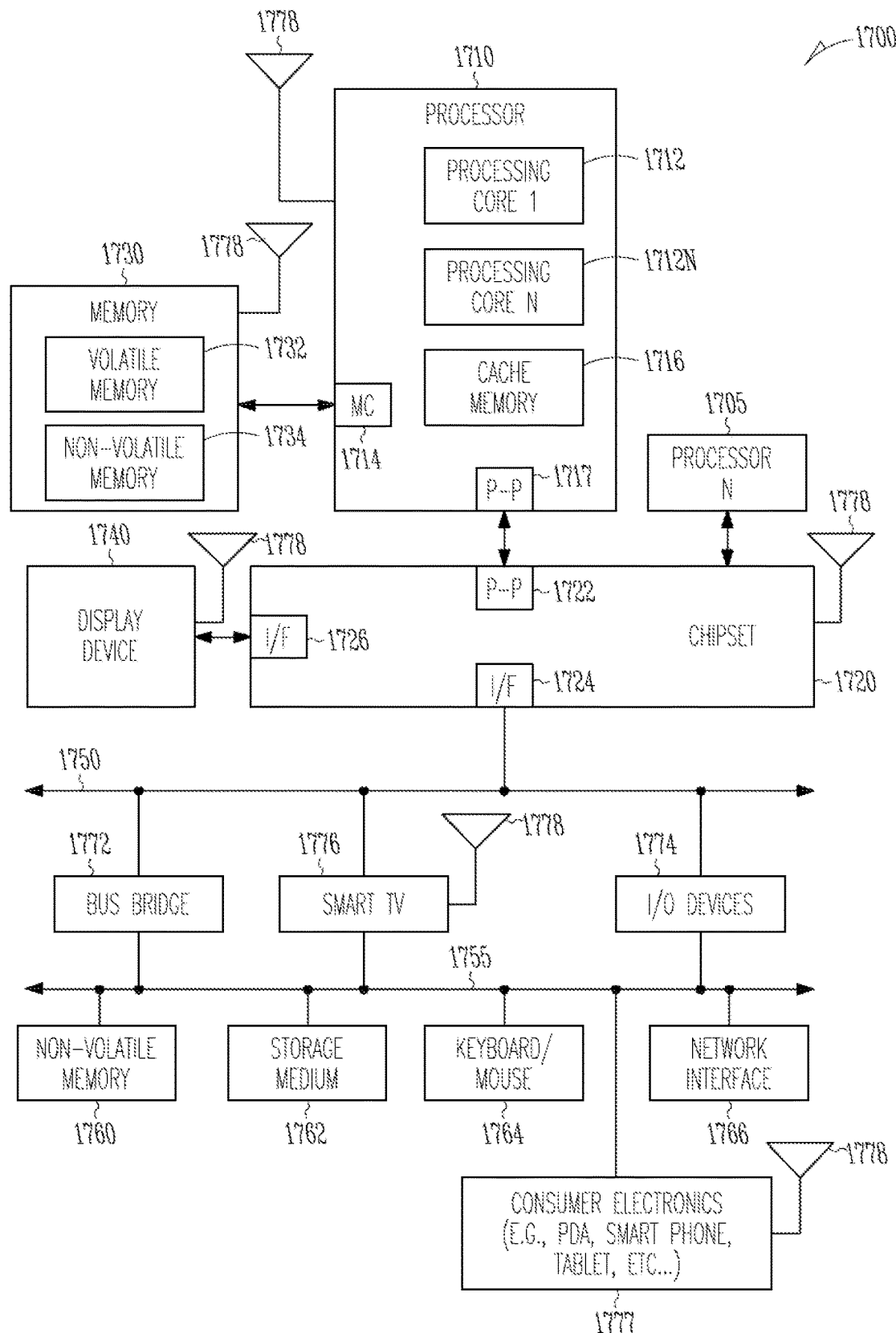
FIG. 17 illustrates a system level diagram, depicting an example of an electronic system including the electronic device as described in the present disclosure.

FIG. 17 illustrates a system level diagram, depicting an example of an electronic device (e.g., system) including the electronic device 100 as described in the present disclosure. FIG. 17 is included to show an example of a higher level device application for the electronic device 100. In one embodiment, system 1700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1700 is a system on a chip (SOC) system.

In one embodiment, processor 1710 has one or more processor cores 1712 and 1712N, where 1712N represents the Nth processor core inside processor 1710 where N is a positive integer. In one embodiment, system 1700 includes multiple processors including 1710 and 1705, where processor 1705 has logic similar or identical to the logic of processor 1710. In some embodiments, processing core 1712 includes, but is not limited to, pre-fetch logic to fetch instructions, decode logic to decode the instructions, execution logic to execute instructions and the like. In some embodiments, processor 1710 has a cache memory 1716 to cache instructions and/or data for system 1700. Cache memory 1716 may be organized into a hierarchal structure including one or more levels of cache memory.

In some embodiments, processor 1710 includes a memory controller 1714, which is operable to perform functions that enable the processor 1710 to access and communicate with memory 1730 that includes a volatile memory 1732 and/or a non-volatile memory 1734. In some embodiments, processor 1710 is coupled with memory 1730 and chipset 1720. Processor 1710 may also be coupled to a wireless antenna 1778 to communicate with any device configured to transmit and/or receive wireless signals. In one embodiment, an interface for wireless antenna 1778 operates in accordance with, but is not limited to, the IEEE 802.11 standard and its related family, Home Plug AV (HPAV), Ultra-Wide Band (UWB), Bluetooth, WiMax, or any form of wireless communication protocol.

In some embodiments, volatile memory 1732 includes, but is not limited to, Synchronous Dynamic Random-Access Memory (SDRAM), Dynamic Random Access Memory (DRAM), RAMBUS Dynamic Random Access Memory (RDRAM), and/or any other type of random access memory device. Non-volatile memory 1734 includes, but is not limited to, flash memory, phase change memory (PCM), read-only memory (ROM), electrically erasable programmable read-only memory (EEPROM), or any other type of non-volatile memory device.

Memory 1730 stores information and instructions to be executed by processor 1710. In one embodiment, memory 1730 may also store temporary variables or other intermediate information while processor 1710 is executing instructions. In the illustrated embodiment, chipset 1720 connects with processor 1710 via Point-to-Point (PtP or P-P) interfaces 1717 and 1722. Chipset 1720 enables processor 1710 to connect to other elements in system 1700. In some embodiments of the example system, interfaces 1717 and 1722 operate in accordance with a PtP communication protocol such as the Intel® QuickPath Interconnect (QPI) or the like. In other embodiments, a different interconnect may be used.

In some embodiments, chipset 1720 is operable to communicate with processor 1710, 1705N, display device 1740, and other devices, including a bus bridge 1772, a smart TV 1776, I/O devices 1774, nonvolatile memory 1760, a storage medium (such as one or more mass storage devices) 1762, a keyboard/mouse 1764, a network interface 1766, and various forms of consumer electronics 1777 (such as a PDA, smart phone, tablet etc.), etc. In one embodiment, chipset 1720 couples with these devices through an interface 1724. Chipset 1720 may also be coupled to a wireless antenna 1778 to communicate with any device configured to transmit and/or receive wireless signals.

Chipset 1720 connects to display device 1740 via interface 1726. Display 1740 may be, for example, a liquid crystal display (LCD), a plasma display, cathode ray tube (CRT) display, or any other form of visual display device. In some embodiments of the example system, processor 1710 and chipset 1720 are merged into a single SOC. In addition, chipset 1720 connects to one or more buses 1750 and 1755 that interconnect various system elements, such as I/O devices 1774, nonvolatile memory 1760, storage medium 1762, a keyboard/mouse 1764, and network interface 1766. Buses 1750 and 1755 may be interconnected together via a bus bridge 1772.

In one embodiment, mass storage device 1762 includes, but is not limited to, a solid-state drive, a hard disk drive, a universal serial bus flash memory drive, or any other form of computer data storage medium. In one embodiment, network interface 1766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 17 are depicted as separate blocks within the system 1700, the functions performed by some of these blocks may be integrated within a single semiconductor circuit or may be implemented using two or more separate integrated circuits. For example, although cache memory 1716 is depicted as a separate block within processor 1710, cache memory 1716 (or selected aspects of 1716) may be incorporated into processor core 1712.

Figure 18:
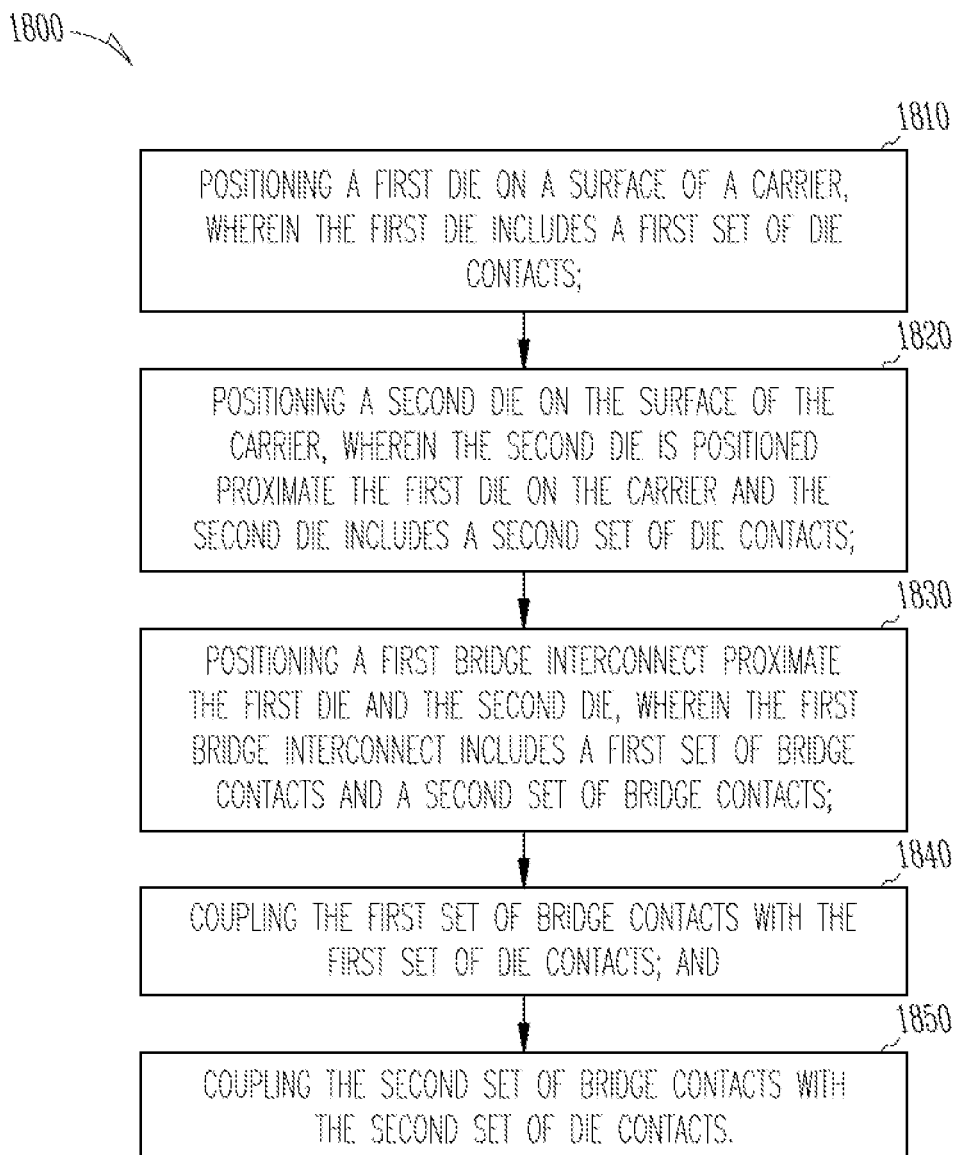
FIG. 18 illustrates a method for manufacturing the electronic device.

FIG. 18 shows one example of a method 1800 for manufacturing an electronic device, including one or more of the electronic device 100 described herein. In describing the method 1800, reference is made to one or more components, features, functions and operations previously described herein. Where convenient, reference is made to the components, features, operations and the like with reference numerals. The reference numerals provided are exemplary and are not exclusive. For instance, components, features, functions, operations and the like described in the method 1800 include, but are not limited to, the corresponding numbered elements provided herein and other corresponding elements described herein (both numbered and unnumbered) as well as their equivalents.

At 1802, the method 1800 may include positioning a first die 110 on a surface of a carrier 200. The first die 110 may include a first set of die contacts (e.g., the first set of die contacts 230 shown in FIG. 2).

At 1804, the method 1800 may include positioning a second die 120 on the surface of the carrier. The second die 120 may be positioned proximate the first die 110 on the carrier 1200. The second die 120 may include a second set of die contacts (e.g., the fourth set of die contacts 260 shown in FIG. 2).

At 1806, the method 1800 may include positioning a first bridge interconnect 140A proximate the first die 110 and the second die 120. The first bridge interconnect 140A may include a first set of bridge contacts 310 and may include a second set of bridge contacts 320.

At 1808, the method 1800 may include coupling the first set of bridge contacts 310 with the first set of die contacts of the first die 110. At 1810, the method 1800 may include coupling the second set of bridge contacts 320 with the second set of die contacts of the second die 120. The method 1800 may include applying an electrically conductive epoxy to the bridge contacts or the die contacts, for instance to directly couple a die (e.g., the first die 110) with the bridge interconnect 140.

The method 1800 may include positioning a third die 130 proximate the first die 120. The third die 130 may include a third set of die contacts (e.g., the sixth set of die contacts 280 shown in FIG. 2). The first die 110 may include a fourth set of die contacts (e.g., the second set of die contacts 240 shown in FIG. 2).

The third die 130 may be positioned on a first side of the first die 110, and the second die 120 may be positioned on a second side of the first die 110. The first side of the first die 110 may be opposite the second side of the first die 110. A fourth die may be positioned on a third side of the first die 110. Additional die (e.g., a fifth die) may be positioned proximate the first die 110.

The method 1800 may include positioning a second bridge interconnect 140B proximate the first die 110 and the third die 130. The second bridge interconnect 140B may include a third set of set of bridge contacts and a fourth set of bridge contacts. The method 1800 may include coupling the third set of bridge contacts with the third set of die contacts. The method 1800 may include coupling the fourth set of bridge contacts with the fourth set of die contacts. The first die 110 and the third die 130 may be in electrical communication through the second bridge interconnect 140B.

The bridge interconnect 140 may facilitate the electrical communication between two or more die. The method 1800 may include positioning the third die 130 proximate the second die 120. In an example, a first bridge interconnect 140A may be coupled to the first die 110 and the second die 120. A second bridge interconnect 140B may be coupled to the second die 120 and the third die 130. The third die 130 may communicate with the first die 110, including (but not limited to), the third die 130 communicating with the first die 110 by transmitting an electrical signal through the first bridge interconnect 140 and the second bridge interconnect 140.

The method 1800 may include directly coupling a third set of bridge contacts with the third set of die contacts (e.g., of the third die 130). The bridge interconnect 140 may facilitate the electrical communication between the first die 110, the second die 120, and the third die 130.

The method 1800 may include coupling a molding material 150 with the first die 110, the second die 120, or the bridge interconnect 140. The method 1800 may include forming (e.g., with an ablation operation) a first opening (e.g., the first opening 500 shown in FIG. 5), and the first opening may be defined in the molding material 150. In an example, the carrier 200 (shown in FIG. 2) may include a transparent material. A detector (e.g., a camera or the like) may examine fiducial marks from a first side (e.g., bottom side) of the carrier 200. A removal apparatus (e.g., a laser) may be positioned proximate the molding material 150 (or the electronic device 100). The removal apparatus may be positioned on a second side (e.g., top side) of the carrier 200. The fiducial marks that may be observed from the first side of the carrier 200 may be referenced in positioning the removal apparatus. The fiducial marks may be referenced, for example, to align the removal apparatus with a contact (e.g., the contact 220 of FIG. 2) of a die (e.g., the first die 110). The removal apparatus may form the opening by removing the molding material 150, and the opening may be aligned with a feature of the electronic device 100 (e.g., the contact). The electronic device 100 may include a second opening, and the second opening may expose a second die contact.

The method 1800 may include forming a via (e.g., the first via 600 shown in FIG. 6) in the first opening by coupling a conductive material (e.g., copper or the like) with the first opening and, for example, a contact of a die. The method 1800 may include removing a portion of the molding material 150 and the via (e.g., by removing material in a grinding operation). A portion of the bridge interconnect may be removed (e.g., ground) from the electronic device 100. The removal of the portions of the molding material 150, the via, and the bridge interconnect 140 may be performed in the same operation (e.g., simultaneously grinding the molding material 150, the via, and the bridge interconnect 140).

The method 1800 may include coupling the first die 110 and the second die 120 with a substrate 160. The substrate 150 may help facilitate the communication of the first die 110 and the second die 120 with external structures (e.g., a motherboard or components of a system on a chip).

The method 1800 may include coupling a bridge interconnect via (e.g., the bridge via 330 shown in FIG. 3) with the substrate 160. The bridge via may be included in the bridge interconnect 140. The bridge via may help establish an electrical communication pathway between the first die 110 and the substrate 160. The method 1800 may include positioning an underfill material between the bridge interconnect 140 and the substrate 160.

Various Notes & Examples

Aspect 1 may include or use subject matter (such as an apparatus, a system, a device, a method, a means for performing acts, or a device readable medium including instructions that, when performed by the device, may cause the device to perform acts, or an article of manufacture), such as may include or use an electronic device.

The electronic device may include a first die. The first die may include a first set of die contacts. The electronic device may include a second die. The second die may include a second set of die contacts. The electronic device may include a bridge interconnect. The bridge interconnect may include a first set of bridge contacts and may include a second set of bridge contacts.

The first set of bridge contacts may be directly coupled to the first set of die contacts, for instance with solder. The second set of bridge contacts may be directly coupled to the second set of die contacts, for instance with solder. The bridge interconnect may facilitate electrical communication between the first die and the second die.

Aspect 2 may include or use, or may optionally be combined with the subject matter of Aspect 1, to optionally include or use that the bridge interconnect may include a third die. The third die may be sized and shaped to overlap a portion of the first die and to overlap a portion of the second die.

Aspect 3 may include or use, or may optionally be combined with the subject matter of one or any combination of Aspects 1 or 2 to optionally include or use that the first die and the second die may be in electrical communication only through the bridge interconnect.

Aspect 4 may include or use, or may optionally be combined with the subject matter of one or any combination of Aspects 1 through 3 to optionally include or use a substrate. The first die and the second die may be coupled to the substrate.

Aspect 5 may include or use, or may optionally be combined with the subject matter of Aspect 4 to optionally include or use that the bridge interconnect may be positioned between the first die and the substrate.

Aspect 6 may include or use, or may optionally be combined with the subject matter of Aspect 5 to optionally include or use an underfill material that may be positioned between the bridge interconnect and the substrate.

Aspect 7 may include or use, or may optionally be combined with the subject matter of Aspect 4 to optionally include or use a first bridge contact. The first bridge contact may be positioned on a first surface of the bridge interconnect. The first bridge contact may be directly coupled to a die contact of the first die, for instance with solder. The electronic device 100 may include a second bridge contact. The second bridge contact may be positioned on a second surface of the bridge interconnect. The second bridge contact may be directly coupled to a substrate contact of the substrate, for instance with solder.

The electronic device may include a bridge via. The bridge via may be included in the bridge interconnect. The bridge via may electrically interconnect the first bridge contact with the second bridge contact. The bridge via may facilitate the electrical communication between the first die and the substrate.

Aspect 8 may include or use, or may optionally be combined with the subject matter of Aspect 7 to optionally include or use an underfill material. The underfill material may form a direct interface with the solder that may directly couple the second bridge contact with the substrate contact.

Aspect 9 may include or use, or may optionally be combined with the subject matter of one or any combination of Aspects 1 through 8 to optionally include or use that the first die and the second die may be coplanar.

Aspect 10 may include or use, or may optionally be combined with the subject matter of one or any combination of Aspects 1 through 9 to optionally include or use a molding material. The molding material may form a direct interface with the first die, the second die, and the bridge interconnect.

Aspect 11 may include or use, or may optionally be combined with the subject matter of Aspect 10 to optionally include or use a die via. The die via may be coupled with the first die. The die via may extend through the molding material.

Aspect 12 may include or use, or may optionally be combined with the subject matter of Aspect 11 to optionally include or use that the bridge interconnect may be coplanar with a portion of the die via.

Aspect 13 may include or use, or may optionally be combined with the subject matter of one or any combination of Aspects 11 or 12 to optionally include or use that a surface of the bridge interconnect may be coplanar with a surface of the molding material.

Aspect 14 may include or use, or may optionally be combined with the subject matter of one or any combination of Aspects 1 through 13 to optionally include or use a third set of die contacts. The third set of die contacts may be included in the first die. The electronic device may include a die via. The die via may be coupled with the third set of die contacts. The first set of die contacts may have a smaller dimension than the third set of die contacts.

Aspect 15 may include or use subject matter (such as an apparatus, a system, a device, a method, a means for performing acts, or a device readable medium including instructions that, when performed by the device, may cause the device to perform acts, or an article of manufacture), such as may include or use an electronic device.

The electronic device may include a substrate. The electronic device may include a first die. The first die may be coupled to the substrate. The first die may include a first set of die contacts. The electronic device may include a second die. The second die may be coupled to the substrate. The second die may include a second set of die contacts.

The electronic device may include a first bridge interconnect. The first bridge interconnect may be spaced from the substrate. The first bridge interconnect may include a first set of bridge contacts. The first bridge interconnect may include a second set of bridge contacts. The first set of bridge contacts may be directly coupled to the first set of die contacts, for instance with an interconnection material. The second set of bridge contacts may be directly coupled to the second set of die contacts, for instance with the interconnection material. The first bridge interconnect may facilitate electrical communication between the first die and the second die.

Aspect 16 may include or use, or may optionally be combined with the subject matter of Aspect 15, to optionally include or use that the first bridge interconnect may be a third die.

Aspect 17 may include or use, or may optionally be combined with the subject matter of one or any combination of Aspects 15 or 16 to optionally include or use that the first die and the second die may be in electrical communication only through the first bridge interconnect.

Aspect 18 may include or use, or may optionally be combined with the subject matter of one or any combination of Aspects 15 through 17 to optionally include or use a third die. The third die may be coupled to the substrate. The third die may include a third set of die contacts. The electronic device may include a fourth set of die contacts. The fourth set of die contacts may be included in the second die.

The electronic device may include a second bridge interconnect. The second bridge interconnect may be spaced from the substrate. The second bridge interconnect may include a third set of bridge contacts and may include a fourth set of bridge contacts. The third set of bridge contacts may be directly coupled to the third set of die contacts, for instance with the interconnection material. The fourth set of bridge contacts may be directly coupled to the fourth set of die contacts, for instance with the interconnection material. The second bridge interconnect may facilitate electrical communication between the second die and the third die.

Aspect 19 may include or use, or may optionally be combined with the subject matter of Aspect 18 to optionally include or use that the first bridge interconnect may be coplanar with the second bridge interconnect.

Aspect 20 may include or use, or may optionally be combined with the subject matter of one or any combination of Aspects 15 through 19 to optionally include or use a third die. The third die may be coupled to the substrate. The third die may include a third set of die contacts. The electronic device may include a third set of bridge contacts. The third set of bridge contacts may be included in the first bridge interconnect. The third set of bridge contacts may be directly coupled to the third set of die contacts, for instance with the interconnection material. The first bridge interconnect may facilitate electrical communication between the first die, the second die, and the third die.

Aspect 21 may include or use subject matter (such as an apparatus, a system, a device, a method, a means for performing acts, or a device readable medium including instructions that, when performed by the device, may cause the device to perform acts, or an article of manufacture), such as may include or use a method for manufacturing an electronic device. The method may include positioning a first die on a surface of a carrier. The first die may include a first set of die contacts.

The method may include positioning a second die on the surface of the carrier. The second die may be positioned proximate (e.g., adjacent or the like) the first die on the carrier. The second die may include a second set of die contacts. The method may include positioning a first bridge interconnect proximate the first die and the second die. The first bridge interconnect may include a first set of bridge contacts and a second set of bridge contacts.

The method may include directly coupling the first set of bridge contacts with the first set of die contacts of the first die. The method may include directly coupling the second set of bridge contacts with the second set of die contacts of the second die.

Aspect 22 may include or use, or may optionally be combined with the subject matter of Aspect 21, to optionally include or use positioning a third die proximate the first die. The third die may include a third set of die contacts. The first die may include a fourth set of die contacts. The method may include positioning a second bridge interconnect proximate the first die and the third die. The second bridge interconnect may include a third set of set of bridge contacts and may include a fourth set of bridge contacts. The method may include coupling the third set of bridge contacts with the third set of die contacts. The method may include directly coupling the fourth set of bridge contacts with the fourth set of die contacts.

Aspect 23 may include or use, or may optionally be combined with the subject matter of one or any combination of Aspects 21 or 22 to optionally include or use coupling a molding material with the first die, the second die, and the first bridge interconnect.

Aspect 24 may include or use, or may optionally be combined with the subject matter of Aspect 23 to optionally include or use forming a first opening. The first opening may be defined in the molding material. The first opening may expose a first die contact of the first die.

Aspect 25 may include or use, or may optionally be combined with the subject matter of Aspect 24 to optionally include or use that the carrier may include a transparent material. The forming of the first opening may include examining fiducial marks from a first side of the transparent carrier. The forming of the first opening may include positioning a removal apparatus proximate the molding material on a second side of the transparent carrier. Positioning the removal apparatus may include referencing the fiducial marks examined on the first side of the transparent carrier. The forming of the first opening may include removing a portion of the molding material and forming the first opening.

Aspect 26 may include or use, or may optionally be combined with the subject matter of one or any combination of Aspect 23 through 25 to optionally include or use forming a second opening. The second opening may be defined in the molding material. The second opening may expose a second die contact of the second die.

Aspect 27 may include or use, or may optionally be combined with the subject matter of one or any combination of Aspect 23 through 26 to optionally include or use forming a via. The via may be formed in the first opening, for instance by coupling a conductive material with the first opening and the first contact of the first die.

Aspect 28 may include or use, or may optionally be combined with the subject matter of one or any combination of Aspect 23 through 27 to optionally include or use removing a portion of the molding material and the via.

Aspect 29 may include or use, or may optionally be combined with the subject matter of Aspect 28 to optionally include or use removing a portion of the bridge interconnect.

Aspect 30 may include or use, or may optionally be combined with the subject matter of one or any combination of Aspects 21 through 29 to optionally include or use that coupling the first set of bridge contacts with the first set of die contacts may include applying an electrically conductive epoxy to the first set of bridge contacts or the first set of die contacts.

Aspect 31 may include or use, or may optionally be combined with the subject matter of one or any combination of Aspects 21 through 30 to optionally include or use coupling the first die and the second die with a substrate.

Aspect 32 may include or use, or may optionally be combined with the subject matter of Aspect 31 to optionally include or use coupling a bridge via with the substrate. The bridge via may be included in the bridge interconnect. The bridge via may establish an electrical communication pathway between the first die and the substrate.

Aspect 33 may include or use, or may optionally be combined with the subject matter of one or any combination of Aspects 31 or 32 to optionally include or use positioning an underfill material between the bridge interconnect and the substrate.

Aspect 34 may include or use, or may optionally be combined with any portion or combination of any portions of any one or more of Aspects 1 through 33 to include or use, subject matter that may include means for performing any one or more of the functions of Aspects 1 through 33, or a machine-readable medium including instructions that, when performed by a machine, cause the machine to perform any one or more of the functions of Aspects 1 through 33.

Each of these non-limiting examples may stand on its own, or may be combined in various permutations or combinations with one or more of the other examples.

The above description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A multi-chip package, comprising:
   a bridge interconnect in a molding material, the bridge interconnect comprising a first plurality of bridge contacts and a second plurality of bridge contacts, and the bridge interconnect having a bottommost surface;
   a first die via and a second die via in the molding material, the first die via and the second die via laterally adjacent to a first side of the bridge interconnect, and the first die via and the second die via each having a bottommost surface co-planar with the bottommost surface of the bridge interconnect;
   a third die via and a fourth die via in the molding material, the third die via and the fourth die via laterally adjacent to a second side of the bridge interconnect, the second side opposite the first side, and the third die via and the fourth die via each having a bottommost surface co-planar with the bottommost surface of the bridge interconnect;
   a first die electrically coupled to the first plurality of bridge contacts of the bridge interconnect, and the first die electrically coupled to the first die via and to the second die via;
   a second die electrically coupled to the second plurality of bridge contacts of the bridge interconnect, and the second die electrically coupled to the third die via and to the fourth die via;
   a plurality of solder balls below molding material;
   an underfill material laterally surrounding the plurality of solder balls and along sides of the molding material, wherein the underfill material has an uppermost surface below a bottommost surface of a semiconductor material of the first die or the second die;
   a substrate having a top surface opposite a bottom surface, the top surface coupled to the plurality of solder balls; and
   a plurality of interconnects coupled to the bottom of the substrate.

2. The multi-chip package of claim 1, wherein the bridge interconnect is in direct contact with the molding material.

3. The multi-chip package of claim 1, wherein the first die via, the second die via, the third die via, and the fourth die via are in direct contact with the molding material.

4. The multi-chip package of claim 1, wherein the bridge interconnect is in direct contact with the molding material, and wherein the first die via, the second die via, the third die via, and the fourth die via are in direct contact with the molding material.

5. The multi-chip package of claim 1, wherein the molding material has a bottommost surface co-planar with the bottommost surface of the bridge interconnect.

6. The multi-chip package of claim 1, further comprising:
   a second bridge interconnect in the molding material, wherein one of the first die or the second die is coupled to the second bridge interconnect; and
   a third die electrically coupled to the second bridge interconnect.

7. The multi-chip package of claim 1, further comprising:
   a substrate beneath the molding material; and
   the underfill material between the molding material and the substrate.

8. The multi-chip package of claim 1, wherein the underfill material is further along a side of the molding material.

9. The multi-chip package of claim 1, wherein the bridge interconnect further comprises a bridge via.

10. The multi-chip package of claim 9, wherein the bridge via is a through silicon via.

11. The multi-chip package of claim 1, wherein the first die via, the second die via, the third die via, and the fourth die via extend above the bridge interconnect.

12. The multi-chip package of claim 1, wherein the molding material is further laterally between the first die and the second die.

13. A multi-chip package, comprising:
   a bridge interconnect in a molding material, the bridge interconnect comprising a first plurality of bridge contacts and a second plurality of bridge contacts on an uppermost surface, and the bridge interconnect having a third plurality of bridge contacts on a bottommost surface;
   a first die via and a second die via in the molding material, the first die via and the second die via laterally adjacent to a first side of the bridge interconnect;
   a third die via and a fourth die via in the molding material, the third die via and the fourth die via laterally adjacent to a second side of the bridge interconnect, the second side opposite the first side;

a first die electrically coupled to the first plurality of bridge contacts of the bridge interconnect, and the first die electrically coupled to the first die via and to the second die via;

a second die electrically coupled to the second plurality of bridge contacts of the bridge interconnect, and the second die electrically coupled to the third die via and to the fourth die via;

a plurality of solder balls below molding material;

an underfill material laterally surrounding the plurality of solder balls and along sides of the molding material, wherein the underfill material has an uppermost surface below a bottommost surface of a semiconductor material of the first die or the second die;

a substrate having a top surface opposite a bottom surface, the top surface coupled to the plurality of solder balls; and a plurality of interconnects coupled to the bottom of the substrate.

14. The multi-chip package of claim 13, wherein the bridge interconnect is in direct contact with the molding material.

15. The multi-chip package of claim 13, wherein the first die via, the second die via, the third die via, and the fourth die via are in direct contact with the molding material.

16. The multi-chip package of claim 13, wherein the bridge interconnect is in direct contact with the molding material, and wherein the first die via, the second die via, the third die via, and the fourth die via are in direct contact with the molding material.

17. The multi-chip package of claim 13, further comprising:

a second bridge interconnect in the molding material, wherein one of the first die or the second die is coupled to the second bridge interconnect; and a third die electrically coupled to the second bridge interconnect.

18. The multi-chip package of claim 13, further comprising:

a substrate beneath the molding material; and the underfill material between the molding material and the substrate.

19. The multi-chip package of claim 13, wherein the underfill material is further along a side of the molding material.

20. The multi-chip package of claim 13, wherein the bridge interconnect further comprises a bridge via.

21. The multi-chip package of claim 20, wherein the bridge via is a through silicon via.

22. The multi-chip package of claim 13, wherein the first die via, the second die via, the third die via, and the fourth die via extend above the bridge interconnect.

23. The multi-chip package of claim 13, wherein the molding material is further laterally between the first die and the second die.

* * * * *